(12) United States Patent
Marpe et al.

(10) Patent No.: US 6,894,628 B2
(45) Date of Patent: May 17, 2005

(54) APPARATUS AND METHODS FOR ENTROPY-ENCODING OR ENTROPY-DECODING USING AN INITIALIZATION OF CONTEXT VARIABLES

(75) Inventors: Detlev Marpe, Berlin (DE); Heiko Schwarz, Berlin (DE); Thomas Wiegand, Berlin (DE)

(73) Assignee: Fraunhofer-Gesellschaft zur Forderung der angewandten Forschung e.V., Munich (DE)

( * ) Notice: Subject to any disclaimer, the term of this patent is extended or adjusted under 35 U.S.C. 154(b) by 72 days.

(21) Appl. No.: 10/623,096

(22) Filed: Jul. 17, 2003

(65) Prior Publication Data

US 2005/0012648 A1 Jan. 20, 2005

(51) Int. Cl.[7] .................................................. H03M 7/00
(52) U.S. Cl. ....................................................... 341/107
(58) Field of Search ................................. 341/107, 106, 341/51

(56) References Cited

U.S. PATENT DOCUMENTS 6,298,160 B1 * 10/2001 Goertzen ..................... 382/232

OTHER PUBLICATIONS

Wiegand, Thomas, et al; "Draft ITU–T; Recommendation and Final Draft International Standard of Joint Video Specification; ITU–T Rec. H.264; ISO/IEC 1449–to AVC"; 8th Meeting; Geneva, Switzerland, May 23–27, 2003.
Wiegand, Thomas, et al; "Overview of the H.264/AVC Video Coding Standard"; IEEE Transaction on Circuit and Systems for Video Technology, vol. 13 No. 7, Jul. 2003.
ISO/IEC 13818–2: 1995 (E) Specification (no month given).
Sullivan, Gary: "Draft Text of Recommendation H.263 Version 2 ("H.263+") for Decision"; Study Group 16 –Contribution COM–999; Study Period 1997–2000 (no month given).
International Organization For Standardization; Organization Normalization; "Information Technology –Coding of Audio Visual Objects–Part 2: Visual"; N4350 (no date given).
Gonzales, C.A., et al; "DCT Coding for Motion Video Storage using Adaptive Arithmetic Coding"; Signal Processing: Image Communication 2 (1960); vol. 2, No. 2, pp. 145–154; Aug. 1990.

(Continued)

Primary Examiner—Brian Young
(74) Attorney, Agent, or Firm—Glenn Patent Group; Michael Glenn

(57) ABSTRACT

An entropy encoding/decoding scheme uses an arithmetic encoder/decoder together with a context modeler for performing a context-based adaptive binary arithmetic coding, which is especially suited for video compression applications. The context modeler includes an initializer for initializing the context modeler by determining and providing initialization probability information to the arithmetic encoder, the initialization probability information to be used by the arithmetic encoder for processing a start symbol of a symbol sequence. The initializer is operative to determine the initialization probability information based on an estimation of the symbol statistics relating to the start symbol such that an initialization probability distribution is different from an equi-probable distribution for all symbols of the symbol set. By means of the initialization, the context-based adaptive binary arithmetic coding/decoding scheme is optimally adjusted before processing a start symbol of the symbol sequence so that no bit rate compression losses because of a delayed context-based adaptation are introduced.

21 Claims, 15 Drawing Sheets

OTHER PUBLICATIONS

Marpe, Detlev, et al; "Adaptive Codes for H.26L"; ITU–T Telecommunications Standardization Sector: Video Coding Experts Group Document; Document VCEG–L13; Twelfth Meeting: Eibsee, Germany, Jan. 9–12, 2001.

Marpe, Detlev, et al; "Further Results for CABAC entropy coding scheme"; ITU–T Telecommunications Standardization Sector; Video Coding Experts Group Document; Document VCEG–M59; Thirteenth Meeting: Austin, Texas, USA Apr. 2–4, 2001.

Marpe, Detlev, et al; "Improved CABAC"; ITU–T Telecommunications Standardization Sector; Video Coding Experts Group Document; Document VCEG–018r1; 15th Meeting: Pattava, Thailand, Dec. 4–6, 2001.

Marpe, Detlev, et al; "New Results on Improved CABAC"; Joint Video Team of ISO/IEC MEG & ITU–T VCEG, Document JVT–B101; 2nd Meeting: Geneva, CH, Jan. 29–Feb. 1, 2002.

Schwarz, Heiko, et al; "Improved CABAC"; Joint Video Team of ISO/IEC MPEG & ITU–T VCEG; Document JVT–CO60; 3rd Meeting: Fairfax, Virginia, USA, May 6–10, 2002.

Marpe, Detlev, et al; "Fast Arithmetic Coding for CABAC"; Joint Video Team of ISO/IEC MPEG & ITU–T VCEG; Document JVT–CO60; 3rd Meeting: Fairfax, Virginia, USA, May 6–10, 2002.

Schwarz, Heiko, et al.; "CABAC and Slices"; Joint Video Team of ISO/IEC MPEG & ITU–T VCEG; Document JVT–D020r1; 4th Meeting: Klagenfurt, Austria, Jul. 22–26, 2002.

Karczewicz, Marta, et al.; "Analysis and Simplification of Intra Prediction"; Joint Video Team of ISO/IEC MPEG & ITU–T VCEG; Document JVT–D025; 4th Meeting: Klagenfurt, Austria, Jul. 22–26, 2002.

Marpe, Detlev, et al.; "Proposed Cleanup changes for CABAC"; Joint Video Team of ISO/IEC MPEG & ITU–T VCEG; Document: JVT–E059; 5th Meeting: Geneva, CH, Oct. 9–17, 2002.

Bossen, Frank; "CABAC cleanup and complexity reduction"; Joint Video Team of ISO/IEC MPEG & ITU–T VCEG; Document: JVT–Exxx; 5th Meeting: Geneva, Switzerland, Oct. 2002.

Marpe, Detlev, et al; "Final CABAC cleanup"; Joint Video Team of ISO/IEC MPEG & ITU–T VCEG; Document: JVT–F039; 6th Meeting: Awaji, Island, JP, Dec. 5–13, 2002.

Marpe, Detlev and Hans L. Cycon; "Very Low Bit –Rate Video Coding Using Wavelet –Based Techniques"; IEEE Transactions on Circuits and Systems for Video Technology; Vol. 9, No. 1, Feb. 1999.

Heising, G., et al; "Wavelet–based very low Bitrate coding using image warping"; IEE Proc.–Vis. Image Signal Process, vol. 148, No. 2, Apr. 2001.

Choi, Seung–Jong, and John W. Woods; "Motion–Compensated 3–D Subband Coding of Video"; IEEE Transactions on Image Processing, vol. 8, No. Feb. 1999.

Said, Amir and William A. Pearlman; "A new fast and efficient image codec based on set partitioning in hierarchical trees"; IEEE Int. Smyp on Circuits and Systems, Chigcago, IL May 1993.

Marpe, Detlev and Hans L. Cycon; "Efficient Pre–Coding Techniques for Wavelet–Based Image Compression"; Proc. Int. Picture Coding Symposium, pp. 45–50, 1997.

Rissanen, Jorma and Glen G. Landgon, Jr; "Universal Modeling and Coding"; IEEE Transactions on Information Theory; vol. It–27, No. 1, Jan. 1981.

Rissanen, Jorma; "Universal Coding, Information, Prediction, and Estimation"; IEEE Transactions on Information Theory; vol. It–30, No. 4, Jul. 1984.

Weinberger, Marcelo J., et al; "Applications of universal context modeling to lossless compression of grey–scale images"; IEEE Transactions on Imaging Processing; vol. 5, No. 4, Apr. 1996.

Teuhola, Jukka; "A Compression Method of Clustered Bit–Vektors"; Information Processing Letters, vol. 7, No. 6, pp. 308–311, Oct. 1978.

Gallager, Robert G. and David C. Van Voorhis; "Optimal Source Codes for Geometrically Distributed Integer Alphabets"; IEEE Transactions on Information Technology; pp. 228–230, Mar. 1975.

Mrak, Marta, et al.; "A Context Modeling Algorithm and its Application in Video Compression"; Fraunhoer–Institute HHI, Berlin, Germany (no date given).

Pennebaker, W.B., et al; "An overview of the basic principles of the Q–Coder adaptive binary arithmetic coder"; IBM. J. Res. Develop, vol. 32, No. 6, Nov. 1988.

Rissanen, Jorma and K. M. Mohiuddin; :A multiplication–free multialphabet arithmetic code; IEEE Transactions on Communications; vol. 37, No. 2, Feb. 1989.

Howard, Paul G. and Jeffrey Scott Viter; "Practical implementations of arithmetic code"; Brown University, Department of Computer Science, Technical Report No. 92–18; Revised version, Apr. 1992, Formerly Technical Report No. CS–91–45.

"Sample Data Coding"; Chapter 12, pp. 473–484 (no date given).

Moffat, Alistair, et al; "Arithmetic Coding Revisited"; ACM Transactions on Information Systems, vol. 16, No. 3, pp. 256–294, Jul. 1998.

Wiegand, Thomas, et al; "Rate–Constrained Coder Control and Comparison of Video Coding Standards"; IEEE Transactions on Circuits and Systems for VideoTechnology; vol. 13, No. 7, Jul. 2003.

Wiegand, Thomas; "Draft ITU–T Recommendation and Final Draft International Standard of Joint Video Specification (ITU–T Rec. H.264; ISO/IEC; 14496–10 AVC)"; Document: JVT–G050; 7th Meeting: Pattaya, Thailand, Mar. 7–14, 2003.

"Video Codec For Audiovisual Services at p. 64 kbit/s"; International Telecommunication Union; H.261 (Mar. 1993).

Wenger, Stephen; "H.264/AVC Over IP"; IEEE Transactions on Circuits and Systems for VideoTechnology; vol. 13, No. 7, Jul. 2003.

Stockhammer, Thomas, et al; "H.264/AVCinWireless Environments"; IEEE Transactions on Circuits and Systems for VideoTechnology; vol. 13, No. 7, Jul. 2003.

Wedi, Thomas and Hans Georg Musmann; "Motion–and Aliasing–Compensated Prediction for Hybrid Video Coding"; IEEE Transactions on Circuits and Systems for Video-Technology; vol. 13, No. 7, Jul. 2003.

Wiegand, Thomas, et al; "Long Term Memory Motion–Compensated Prediction"; IEEE Transactions on Circuits and Systems for VideoTechnology; vol. 9, No. 1, Feb. 1999.

Flierl, Markus, et al; "A locally design algorithm block–based multi–hypothesis motion–compensated prediction"; Proceedings of the IEEE DCC, pp. 239–248, Snowbird, Utah; Mar. 1988.

Flierl, Markus and Bernd Girod; "Generalized B Pictures and the Draft H.264/AVC Codec"; IEEE Transactions on Circuits and Systems for VideoTechnology; vol. 13, No. 7, Jul. 2003.

Karczewicz, Marta and Ragip Kurceren; "The SP –and SI –Frames Design for H.264/AVC"; IEEE Transactions on Circuits and Systems for VideoTechnology; vol. 13, No. 7, Jul. 2003.

Marpe, Detlev et al; "Context–Based Adaptive Binary Arithmetic Coding in the H.264/AVC Video Compression Standard"; IEEE Transactions on Circuits and Systems for VideoTechnology; vol. 13, No. 7, Jul. 2003.

Malvar, Henrique S. et al; "Low–complexity Transformed Quantization in H.264/AVC"; IEEE Transactions on Circuits and Systems for VideoTechnology; vol. 13, No. 7, Jul. 2003.

List, Peter, et al; "Adaptive Deblocking Filter"; IEEE Transactions on Circuits and Systems for VideoTechnology; vol. 13, No. 7, Jul. 2003.

Ribas–Cobera, Jordi et al; "A Generalized Hypothetical Reference Decoder for H.264/AVC"; IEEE Transactions on Circuits and Systems for VideoTechnology; vol. 13, No. 7, Jul. 2003.

Marpe, Detlev et al; "Proposed Editorial Changes and Cleanup of CABAC"; Joint Video Team of ISO/IEC MPEG & ITU–T VCEG; Document JVT–D019; 4th Meeting: Klagenfurt, Austria. Jul. 22–26, 2002.

Wiegand, Thomas: "Study of Final Committee Draft of Joint Video Specification (ITU–T Rec. H.264, ISO/IEC 14496–10 AVC0)"; Joint Video Team of ISO/IEC MPEG & ITU–T VCEG; Document JVT–F100d2; 6th Meeting: Awaji, Island, JP, Dec. 5–13, 2002.

The Concept of a Random Variable, pp. 82–84. (no date given).

Marpe, Detlev, et al; "Fast Arithmetic Coding for CABAC"; Joint Video Team of ISO/IEC MPEG & ITU–T VCEG; Document JVT–C061; 3rd Meeting: Fairfax, Virginia, USA, Mar. 6–10, 2002.

* cited by examiner

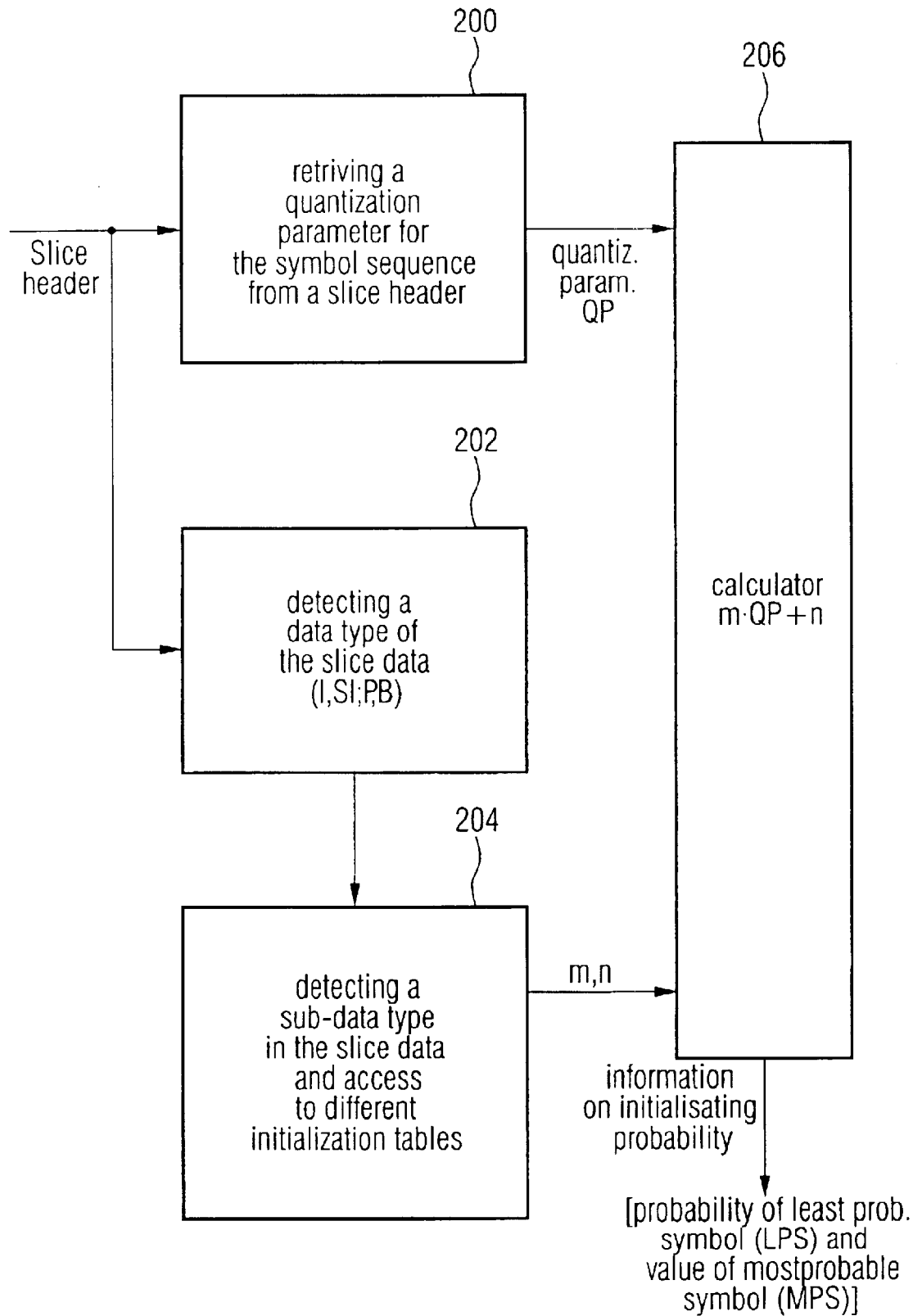

FIG 3 preCtxState = max( 1, min( 126, ( ( m*SliceQP ) >> 4 ) + n ) )
if( preCtxState <= 63 ) {
    pStateIdx = 63 - preCtxState
    valMPS  = 0
} else {
    pStateIdx = preCtxState - 64
    valMPS  = 1
}
preCtxState : auxiliary variable
m, n : $1^{st}$, $2^{nd}$ table indices (initialization variables)
min : minimum function
SliceQP : Slice quantization parameter
pStateIdx : reference to initialization
          probability information table
          including probability information
          for the least probable symbol (LPS)
valMPS : value of most probable symbol
valLPS : value of least probable symbol

FIG 4A

| Initialisation variables | ctxIdx | | | | | | | | | | |
|---|---|---|---|---|---|---|---|---|---|---|---|
| | 0 | 1 | 2 | 3 | 4 | 5 | 6 | 7 | 8 | 9 | 10 |
| m | 20 | 2 | 3 | 20 | 2 | 3 | -28 | -23 | -6 | -1 | 7 |
| n | -15 | 54 | 74 | -15 | 54 | 74 | 127 | 104 | 53 | 54 | 51 |

Table 1 – Values of variables m and n for ctxIdx from 0 to 10

FIG 4B

| Value of cabac_init_idc | Initialisation variables | ctxIdx | | | | | | | | | | | | |
|---|---|---|---|---|---|---|---|---|---|---|---|---|---|
| | | 11 | 12 | 13 | 14 | 15 | 16 | 17 | 18 | 19 | 20 | 21 | 22 | 23 |
| 0 | m | 23 | 23 | 21 | 1 | 0 | -37 | 5 | -13 | -11 | 1 | 12 | -4 | 17 |
| | n | 33 | 2 | 0 | 9 | 49 | 118 | 57 | 78 | 65 | 62 | 49 | 73 | 50 |
| 1 | m | 22 | 34 | 16 | -2 | 4 | -29 | 2 | -6 | -13 | 5 | 9 | -3 | 10 |
| | n | 25 | 0 | 0 | 9 | 41 | 118 | 65 | 71 | 79 | 52 | 50 | 70 | 54 |
| 2 | m | 29 | 25 | 14 | -10 | -3 | -27 | 26 | -4 | -24 | 5 | 6 | -17 | 14 |
| | n | 16 | 0 | 0 | 51 | 62 | 99 | 16 | 85 | 102 | 57 | 57 | 73 | 57 |

Table 2 – Values of variables m and n for ctxIdx from 11 to 23

FIG 4C

| Value of cabac_init_idc | Initialisation variables | ctxIdx | | | | | | | | | | | | | | | |
|---|---|---|---|---|---|---|---|---|---|---|---|---|---|---|---|---|
| | | 24 | 25 | 26 | 27 | 28 | 29 | 30 | 31 | 32 | 33 | 34 | 35 | 36 | 37 | 38 | 39 |
| 0 | m | 18 | 9 | 29 | 26 | 16 | 9 | -46 | -20 | 1 | -13 | -11 | 1 | -6 | -17 | -6 | 9 |
| | n | 64 | 43 | 0 | 67 | 90 | 104 | 127 | 104 | 67 | 78 | 65 | 62 | 86 | 95 | 61 | 45 |
| 1 | m | 26 | 19 | 40 | 57 | 41 | 26 | -45 | -15 | -4 | -6 | -13 | 5 | 6 | -13 | 0 | 8 |
| | n | 34 | 22 | 0 | 2 | 36 | 69 | 127 | 101 | 76 | 71 | 79 | 52 | 69 | 90 | 52 | 43 |
| 2 | m | 20 | 20 | 29 | 54 | 37 | 12 | -32 | -22 | -2 | -4 | -24 | 5 | -6 | -14 | -6 | 4 |
| | n | 40 | 10 | 0 | 0 | 42 | 97 | 127 | 117 | 74 | 85 | 102 | 57 | 93 | 88 | 44 | 55 |

Table 3 – Values of variables m and n for ctxIdx from 24 to 39

FIG 4D

| Value of cabac_init_idc | Initialisation variables | ctxIdx | | | | | | | | | | | | | |
|---|---|---|---|---|---|---|---|---|---|---|---|---|---|---|
| | | 40 | 41 | 42 | 43 | 44 | 45 | 46 | 47 | 48 | 49 | 50 | 51 | 52 | 53 |
| 0 | m | -3 | -6 | -11 | 6 | 7 | -5 | 2 | 0 | -3 | -10 | 5 | 4 | -3 | 0 |
| | n | 69 | 81 | 96 | 55 | 67 | 86 | 88 | 58 | 76 | 94 | 54 | 69 | 81 | 88 |
| 1 | m | -2 | -5 | -10 | 2 | 2 | -3 | -3 | 1 | -3 | -6 | 0 | -3 | -7 | -5 |
| | n | 69 | 82 | 96 | 59 | 75 | 87 | 100 | 56 | 74 | 85 | 59 | 81 | 86 | 95 |
| 2 | m | -11 | -15 | -21 | 19 | 20 | 4 | 6 | 1 | -5 | -13 | 5 | 6 | -3 | -1 |
| | n | 89 | 103 | 116 | 57 | 58 | 84 | 96 | 63 | 85 | 106 | 63 | 75 | 90 | 101 |

Table 4 – Values of variables m and n for ctxIdx from 40 to 53

FIG 4E

| Value of cabac_init_idc | Initialisation variables | ctxIdx | | | | | |
|---|---|---|---|---|---|---|---|
| | | 54 | 55 | 56 | 57 | 58 | 59 |
| 0 | m | -7 | -5 | -4 | -5 | -7 | 1 |
| | n | 67 | 74 | 74 | 80 | 72 | 58 |
| 1 | m | -1 | -1 | 1 | -2 | -5 | 0 |
| | n | 66 | 77 | 70 | 86 | 72 | 61 |
| 2 | m | 3 | -4 | -2 | -12 | -7 | 1 |
| | n | 55 | 79 | 75 | 97 | 50 | 60 |

Table 5 – Values of variables m and n for ctxIdx from 54 to 59

FIG 4F

| Initialisation variables | ctxIdx | | | | | | | | | |
|---|---|---|---|---|---|---|---|---|---|---|
| | 60 | 61 | 62 | 63 | 64 | 65 | 66 | 67 | 68 | 69 |
| m | 0 | 0 | 0 | 0 | -9 | 4 | 0 | -7 | 13 | 3 |
| n | 41 | 63 | 63 | 63 | 83 | 86 | 97 | 72 | 41 | 62 |

Table 6 – Values of variables m and n for ctxIdx from 60 to 69

FIG 4G

| ctxIdx | I and SI slices | | Value of cabac_init_idc | | | | | | ctxIdx | I and SI slices | | Value of cabac_init_idc | | | | | |
|---|---|---|---|---|---|---|---|---|---|---|---|---|---|---|---|---|---|
| | | | 0 | | 1 | | 2 | | | | | 0 | | 1 | | 2 | |
| | m | n | m | n | m | n | m | n | | m | n | m | n | m | n | m | n |
| 70 | 0 | 11 | 0 | 45 | 13 | 15 | 7 | 34 | 88 | -11 | 115 | -13 | 108 | -4 | 92 | 5 | 78 |
| 71 | 1 | 55 | -4 | 78 | 7 | 51 | -9 | 88 | 89 | -12 | 63 | -3 | 46 | 0 | 39 | -6 | 55 |
| 72 | 0 | 69 | -3 | 96 | 2 | 80 | -20 | 127 | 90 | -2 | 68 | -1 | 65 | 0 | 65 | 4 | 61 |
| 73 | -17 | 127 | -27 | 126 | -39 | 127 | -36 | 127 | 91 | -15 | 84 | -1 | 57 | -15 | 84 | -14 | 83 |
| 74 | -13 | 102 | -28 | 98 | -18 | 91 | -17 | 91 | 92 | -13 | 104 | -9 | 93 | -35 | 127 | -37 | 127 |
| 75 | 0 | 82 | -25 | 101 | -17 | 96 | -14 | 95 | 93 | -3 | 70 | -3 | 74 | -2 | 73 | -5 | 79 |
| 76 | -7 | 74 | -23 | 67 | -26 | 81 | -25 | 84 | 94 | -8 | 93 | -9 | 92 | -12 | 104 | -11 | 104 |
| 77 | -21 | 107 | -28 | 82 | -35 | 98 | -25 | 86 | 95 | -10 | 90 | -8 | 87 | -9 | 91 | -11 | 91 |
| 78 | -27 | 127 | -20 | 94 | -24 | 102 | -12 | 89 | 96 | -30 | 127 | -23 | 126 | -31 | 127 | -30 | 127 |
| 79 | -31 | 127 | -16 | 83 | -23 | 97 | -17 | 91 | 97 | -1 | 74 | 5 | 54 | 3 | 55 | 0 | 65 |
| 80 | -24 | 127 | -22 | 110 | -27 | 119 | -31 | 127 | 98 | -6 | 97 | 6 | 60 | 7 | 56 | -2 | 79 |
| 81 | -18 | 95 | -21 | 91 | -24 | 99 | -14 | 76 | 99 | -7 | 91 | 6 | 59 | 7 | 55 | 0 | 72 |
| 82 | -27 | 127 | -18 | 102 | -21 | 110 | -18 | 103 | 100 | -20 | 127 | 6 | 69 | 8 | 61 | -4 | 92 |
| 83 | -21 | 114 | -13 | 93 | -18 | 102 | -13 | 90 | 101 | -4 | 56 | -1 | 48 | -3 | 53 | -6 | 56 |
| 84 | -30 | 127 | -29 | 127 | -36 | 127 | -37 | 127 | 102 | -5 | 82 | 0 | 68 | 0 | 68 | 3 | 68 |
| 85 | -17 | 123 | -7 | 92 | 0 | 80 | 11 | 80 | 103 | -7 | 76 | -4 | 69 | -7 | 74 | -8 | 71 |
| 86 | -12 | 115 | -5 | 89 | -5 | 89 | 5 | 76 | 104 | -22 | 125 | -8 | 88 | -9 | 88 | -13 | 98 |
| 87 | -16 | 122 | -7 | 96 | -7 | 94 | 2 | 84 | | | | | | | | | |

Table 7 – Values of variables m and n for ctxIdx from 70 to 104

FIG 4H

| ctxIdx | I and SI slices | | Value of cabac_init_idc | | | | | | ctxIdx | I and SI slices | | Value of cabac_init_idc | | | | | |
|---|---|---|---|---|---|---|---|---|---|---|---|---|---|---|---|---|---|
| | | | 0 | | 1 | | 2 | | | | | 0 | | 1 | | 2 | |
| | m | n | m | n | m | n | m | n | | m | n | m | n | m | n | m | n |
| 105 | -7 | 93 | -2 | 85 | -13 | 103 | -4 | 86 | 136 | -13 | 101 | 5 | 53 | 0 | 58 | -5 | 75 |
| 106 | -11 | 87 | -6 | 78 | -13 | 91 | -12 | 88 | 137 | -13 | 91 | -2 | 61 | -1 | 60 | -8 | 80 |
| 107 | -3 | 77 | -1 | 75 | -9 | 89 | -5 | 82 | 138 | -12 | 94 | 0 | 56 | -3 | 61 | -21 | 83 |
| 108 | -5 | 71 | -7 | 77 | -14 | 92 | -3 | 72 | 139 | -10 | 88 | 0 | 56 | -8 | 67 | -21 | 64 |
| 109 | -4 | 63 | 2 | 54 | -8 | 76 | -4 | 67 | 140 | -16 | 84 | -13 | 63 | -25 | 84 | -13 | 31 |
| 110 | -4 | 68 | 5 | 50 | -12 | 87 | -8 | 72 | 141 | -10 | 86 | -5 | 60 | -14 | 74 | -25 | 64 |
| 111 | -12 | 84 | -3 | 68 | -23 | 110 | -16 | 89 | 142 | -7 | 83 | -1 | 62 | -5 | 65 | -29 | 94 |
| 112 | -7 | 62 | 1 | 50 | -24 | 105 | -9 | 69 | 143 | -13 | 87 | 4 | 57 | 5 | 52 | 9 | 75 |
| 113 | -7 | 65 | 6 | 42 | -10 | 78 | -1 | 59 | 144 | -19 | 94 | -6 | 69 | 2 | 57 | 17 | 63 |
| 114 | 8 | 61 | -4 | 81 | -20 | 112 | 5 | 66 | 145 | 1 | 70 | 4 | 57 | 0 | 61 | -8 | 74 |
| 115 | 5 | 56 | 1 | 63 | -17 | 99 | 4 | 57 | 146 | 0 | 72 | 14 | 39 | -9 | 69 | -5 | 35 |
| 116 | -2 | 66 | -4 | 70 | -78 | 127 | -4 | 71 | 147 | -5 | 74 | 4 | 51 | -11 | 70 | -2 | 27 |
| 117 | 1 | 64 | 0 | 67 | -70 | 127 | -2 | 71 | 148 | 18 | 59 | 13 | 68 | 18 | 55 | 13 | 91 |
| 118 | 0 | 61 | 2 | 57 | -50 | 127 | 2 | 58 | 149 | -8 | 102 | 3 | 64 | -4 | 71 | 3 | 65 |
| 119 | -2 | 78 | -2 | 76 | -46 | 127 | -1 | 74 | 150 | -15 | 100 | 1 | 61 | 0 | 58 | -7 | 69 |
| 120 | 1 | 50 | 11 | 35 | -4 | 66 | -4 | 44 | 151 | 0 | 95 | 9 | 63 | 7 | 61 | 8 | 77 |
| 121 | 7 | 52 | 4 | 64 | -5 | 78 | -1 | 69 | 152 | -4 | 75 | 7 | 50 | 9 | 41 | -10 | 66 |
| 122 | 10 | 35 | 1 | 61 | -4 | 71 | 0 | 62 | 153 | 2 | 72 | 16 | 39 | 18 | 25 | 3 | 62 |
| 123 | 0 | 44 | 11 | 35 | -8 | 72 | -7 | 51 | 154 | -11 | 75 | 5 | 44 | 9 | 32 | -3 | 68 |
| 124 | 11 | 38 | 18 | 25 | 2 | 59 | -4 | 47 | 155 | -3 | 71 | 4 | 52 | 5 | 43 | -20 | 81 |
| 125 | 1 | 45 | 12 | 24 | -1 | 55 | -6 | 42 | 156 | 15 | 46 | 11 | 48 | 9 | 47 | 0 | 30 |
| 126 | 0 | 46 | 13 | 29 | -7 | 70 | -3 | 41 | 157 | -13 | 69 | -5 | 60 | 0 | 44 | 1 | 7 |
| 127 | 5 | 44 | 13 | 36 | -6 | 75 | -6 | 53 | 158 | 0 | 62 | -1 | 59 | 0 | 51 | -3 | 23 |
| 128 | 31 | 17 | -10 | 93 | -8 | 89 | 8 | 76 | 159 | 0 | 65 | 0 | 59 | 2 | 46 | -21 | 74 |
| 129 | 1 | 51 | -7 | 73 | -34 | 119 | -9 | 78 | 160 | 21 | 37 | 22 | 33 | 19 | 38 | 16 | 66 |
| 130 | 7 | 50 | -2 | 73 | -3 | 75 | -11 | 83 | 161 | -15 | 72 | 5 | 44 | -4 | 66 | -23 | 124 |
| 131 | 28 | 19 | 13 | 46 | 32 | 20 | 9 | 52 | 162 | 9 | 57 | 14 | 43 | 15 | 38 | 17 | 37 |
| 132 | 16 | 33 | 9 | 49 | 30 | 22 | 0 | 67 | 163 | 16 | 54 | -1 | 78 | 12 | 42 | 44 | -18 |
| 133 | 14 | 62 | -7 | 100 | -44 | 127 | -5 | 90 | 164 | 0 | 62 | 0 | 60 | 9 | 34 | 50 | -34 |
| 134 | -13 | 108 | 9 | 53 | 0 | 54 | 1 | 67 | 165 | 12 | 72 | 9 | 69 | 0 | 89 | -22 | 127 |
| 135 | -15 | 100 | 2 | 53 | -5 | 61 | -13 | 72 | | | | | | | | | |

Table 8 – Values f variables m and n for ctxIdx from 105 to 165

FIG 41

| ctxIdx | I and SI slices | | Value of cabac_init_idc | | | | | | ctxIdx | I and SI slices | | Value of cabac_init_idc | | | | | |
|---|---|---|---|---|---|---|---|---|---|---|---|---|---|---|---|---|---|
| | | | 0 | | 1 | | 2 | | | | | 0 | | 1 | | 2 | |
| | m | n | m | n | m | n | m | n | | m | n | m | n | m | n | m | n |
| 166 | 24 | 0 | 11 | 28 | 4 | 45 | 4 | 39 | 197 | 26 | -17 | 28 | 3 | 36 | -28 | 28 | -3 |
| 167 | 15 | 9 | 2 | 40 | 10 | 28 | 0 | 42 | 198 | 30 | -25 | 28 | 4 | 38 | -28 | 24 | 10 |
| 168 | 8 | 25 | 3 | 44 | 10 | 31 | 7 | 34 | 199 | 28 | -20 | 32 | 0 | 38 | -27 | 27 | 0 |
| 169 | 13 | 18 | 0 | 49 | 33 | -11 | 11 | 29 | 200 | 33 | -23 | 34 | -1 | 34 | -18 | 34 | -14 |
| 170 | 15 | 9 | 0 | 46 | 52 | -43 | 8 | 31 | 201 | 37 | -27 | 30 | 6 | 35 | -16 | 52 | -44 |
| 171 | 13 | 19 | 2 | 44 | 18 | 15 | 6 | 37 | 202 | 33 | -23 | 30 | 6 | 34 | -14 | 39 | -24 |
| 172 | 10 | 37 | 2 | 51 | 28 | 0 | 7 | 42 | 203 | 40 | -28 | 32 | 9 | 32 | -8 | 19 | 17 |
| 173 | 12 | 18 | 0 | 47 | 35 | -22 | 3 | 40 | 204 | 38 | -17 | 31 | 19 | 37 | -6 | 31 | 25 |
| 174 | 6 | 29 | 4 | 39 | 38 | -25 | 8 | 33 | 205 | 33 | -11 | 26 | 27 | 35 | 0 | 36 | 29 |
| 175 | 20 | 33 | 2 | 62 | 34 | 0 | 13 | 43 | 206 | 40 | -15 | 26 | 30 | 30 | 10 | 24 | 33 |
| 176 | 15 | 30 | 6 | 46 | 39 | -18 | 13 | 36 | 207 | 41 | -6 | 37 | 20 | 28 | 18 | 34 | 15 |
| 177 | 4 | 45 | 0 | 54 | 32 | -12 | 4 | 47 | 208 | 38 | 1 | 28 | 34 | 26 | 25 | 30 | 20 |
| 178 | 1 | 58 | 3 | 54 | 102 | -94 | 3 | 55 | 209 | 41 | 17 | 17 | 70 | 29 | 41 | 22 | 73 |
| 179 | 0 | 62 | 2 | 58 | 0 | 0 | 2 | 58 | 210 | 30 | -6 | 1 | 67 | 0 | 75 | 20 | 34 |
| 180 | 7 | 61 | 4 | 63 | 56 | -15 | 6 | 60 | 211 | 27 | 3 | 5 | 59 | 2 | 72 | 19 | 31 |
| 181 | 12 | 38 | 6 | 51 | 33 | -4 | 8 | 44 | 212 | 26 | 22 | 9 | 67 | 8 | 77 | 27 | 44 |
| 182 | 11 | 45 | 6 | 57 | 29 | 10 | 11 | 44 | 213 | 37 | -16 | 16 | 30 | 14 | 35 | 19 | 16 |
| 183 | 15 | 39 | 7 | 53 | 37 | -5 | 14 | 42 | 214 | 35 | -4 | 18 | 32 | 18 | 31 | 15 | 36 |
| 184 | 11 | 42 | 6 | 52 | 51 | -29 | 7 | 48 | 215 | 38 | -8 | 18 | 35 | 17 | 35 | 15 | 36 |
| 185 | 13 | 44 | 6 | 55 | 39 | -9 | 4 | 56 | 216 | 38 | -3 | 22 | 29 | 21 | 30 | 21 | 28 |
| 186 | 16 | 45 | 11 | 45 | 52 | -34 | 4 | 52 | 217 | 37 | 3 | 24 | 31 | 17 | 45 | 25 | 21 |
| 187 | 12 | 41 | 14 | 36 | 69 | -58 | 13 | 37 | 218 | 38 | 5 | 23 | 38 | 20 | 42 | 30 | 20 |
| 188 | 10 | 49 | 8 | 53 | 67 | -63 | 9 | 49 | 219 | 42 | 0 | 18 | 43 | 18 | 45 | 31 | 12 |
| 189 | 30 | 34 | -1 | 82 | 44 | -5 | 19 | 58 | 220 | 35 | 16 | 20 | 41 | 27 | 26 | 27 | 16 |
| 190 | 18 | 42 | 7 | 55 | 32 | 7 | 10 | 48 | 221 | 39 | 22 | 11 | 63 | 16 | 54 | 24 | 42 |
| 191 | 10 | 55 | -3 | 78 | 55 | -29 | 12 | 45 | 222 | 14 | 48 | 9 | 59 | 7 | 66 | 0 | 93 |
| 192 | 17 | 51 | 15 | 46 | 32 | 1 | 0 | 69 | 223 | 27 | 37 | 9 | 64 | 16 | 56 | 14 | 56 |
| 193 | 17 | 46 | 22 | 31 | 0 | 0 | 20 | 33 | 224 | 21 | 60 | -1 | 94 | 11 | 73 | 15 | 57 |
| 194 | 0 | 89 | -1 | 84 | 27 | 36 | 8 | 63 | 225 | 12 | 68 | -2 | 89 | 10 | 67 | 26 | 38 |
| 195 | 26 | -19 | 25 | 7 | 33 | -25 | 35 | -18 | 226 | 2 | 97 | -9 | 108 | -10 | 116 | -24 | 127 |
| 196 | 22 | -17 | 30 | -7 | 34 | -30 | 33 | -25 | | | | | | | | | |

Table 9 – Values of variables m and n for ctxIdx from 166 t 226

FIG 4J

| ctxIdx | I and SI slices | | Value of cabac_init_idc | | | | | | ctxIdx | I and SI slices | | Value of cabac_init_idc | | | | | |
|---|---|---|---|---|---|---|---|---|---|---|---|---|---|---|---|---|---|
| | | | 0 | | 1 | | 2 | | | | | 0 | | 1 | | 2 | |
| | m | n | m | n | m | n | m | n | | m | n | m | n | m | n | m | n |
| 227 | -3 | 71 | -6 | 76 | -23 | 112 | -24 | 115 | 252 | -12 | 73 | -6 | 55 | -16 | 72 | -14 | 75 |
| 228 | -6 | 42 | -2 | 44 | -15 | 71 | -22 | 82 | 253 | -8 | 76 | 0 | 58 | -7 | 69 | -10 | 79 |
| 229 | -5 | 50 | 0 | 45 | -7 | 61 | -9 | 62 | 254 | -7 | 80 | 0 | 64 | -4 | 69 | -9 | 83 |
| 230 | -3 | 54 | 0 | 52 | 0 | 53 | 0 | 53 | 255 | -9 | 88 | -3 | 74 | -5 | 74 | -12 | 92 |
| 231 | -2 | 62 | -3 | 64 | -5 | 66 | 0 | 59 | 256 | -17 | 110 | -10 | 90 | -9 | 86 | -18 | 108 |
| 232 | 0 | 58 | -2 | 59 | -11 | 77 | -14 | 85 | 257 | -11 | 97 | 0 | 70 | 2 | 66 | -4 | 79 |
| 233 | 1 | 63 | -4 | 70 | -9 | 80 | -13 | 89 | 258 | -20 | 84 | -4 | 29 | -9 | 34 | -22 | 69 |
| 234 | -2 | 72 | -4 | 75 | -9 | 84 | -13 | 94 | 259 | -11 | 79 | 5 | 31 | 1 | 32 | -16 | 75 |
| 235 | -1 | 74 | -8 | 82 | -10 | 87 | -11 | 92 | 260 | -6 | 73 | 7 | 42 | 11 | 31 | -2 | 58 |
| 236 | -9 | 91 | -17 | 102 | -34 | 127 | -29 | 127 | 261 | -4 | 74 | 1 | 59 | 5 | 52 | 1 | 58 |
| 237 | -5 | 67 | -9 | 77 | -21 | 101 | -21 | 100 | 262 | -13 | 86 | -2 | 58 | -2 | 55 | -13 | 78 |
| 238 | -5 | 27 | 3 | 24 | -3 | 39 | -14 | 57 | 263 | -13 | 96 | -3 | 72 | -2 | 67 | -9 | 83 |
| 239 | -3 | 39 | 0 | 42 | -5 | 53 | -12 | 67 | 264 | -11 | 97 | -3 | 81 | 0 | 73 | -4 | 81 |
| 240 | -2 | 44 | 0 | 48 | -7 | 61 | -11 | 71 | 265 | -19 | 117 | -11 | 97 | -8 | 89 | -13 | 99 |
| 241 | 0 | 46 | 0 | 55 | -11 | 75 | -10 | 77 | 266 | -8 | 78 | 0 | 58 | 3 | 52 | -13 | 81 |
| 242 | -16 | 64 | -6 | 59 | -15 | 77 | -21 | 85 | 267 | -5 | 33 | 8 | 5 | 7 | 4 | -6 | 38 |
| 243 | -8 | 68 | -7 | 71 | -17 | 91 | -16 | 88 | 268 | -4 | 48 | 10 | 14 | 10 | 8 | -13 | 62 |
| 244 | -10 | 78 | -12 | 83 | -25 | 107 | -23 | 104 | 269 | -2 | 53 | 14 | 18 | 17 | 8 | -6 | 58 |
| 245 | -6 | 77 | -11 | 87 | -25 | 111 | -15 | 98 | 270 | -3 | 62 | 13 | 27 | 16 | 19 | -2 | 59 |
| 246 | -10 | 86 | -30 | 119 | -28 | 122 | -37 | 127 | 271 | -13 | 71 | 2 | 40 | 3 | 37 | -16 | 73 |
| 247 | -12 | 92 | 1 | 58 | -11 | 76 | -10 | 82 | 272 | -10 | 79 | 0 | 58 | -1 | 61 | -10 | 76 |
| 248 | -15 | 55 | -3 | 29 | -10 | 44 | -8 | 48 | 273 | -12 | 86 | -3 | 70 | -5 | 73 | -13 | 86 |
| 249 | -10 | 60 | -1 | 36 | -10 | 52 | -8 | 61 | 274 | -13 | 90 | -6 | 79 | -1 | 70 | -9 | 83 |
| 250 | -6 | 62 | 1 | 38 | -10 | 57 | -8 | 66 | 275 | -14 | 97 | -8 | 85 | -4 | 78 | -10 | 87 |
| 251 | -4 | 65 | 2 | 43 | -9 | 58 | -7 | 70 | | | | | | | | | |

Table 10 – Values of variables m and n for ctxIdx from 227 to 275

FIG 4K

| ctxIdx | I and SI slices | | Value of cabac_init_idc | | | | | | ctxIdx | I and SI slices | | Value of cabac_init_idc | | | | | |
|---|---|---|---|---|---|---|---|---|---|---|---|---|---|---|---|---|---|
| | | | 0 | | 1 | | 2 | | | | | 0 | | 1 | | 2 | |
| | m | n | m | n | m | n | m | n | | m | n | m | n | m | n | m | n |
| 277 | -6 | 93 | -13 | 106 | -21 | 126 | -22 | 127 | 308 | -16 | 96 | -1 | 51 | -16 | 77 | -10 | 67 |
| 278 | -6 | 84 | -16 | 106 | -23 | 124 | -25 | 127 | 309 | -7 | 88 | 7 | 49 | -2 | 64 | 1 | 68 |
| 279 | -8 | 79 | -10 | 87 | -20 | 110 | -25 | 120 | 310 | -8 | 85 | 8 | 52 | 2 | 61 | 0 | 77 |
| 280 | 0 | 66 | -21 | 114 | -26 | 126 | -27 | 127 | 311 | -7 | 85 | 9 | 41 | -6 | 67 | 2 | 64 |
| 281 | -1 | 71 | -18 | 110 | -25 | 124 | -19 | 114 | 312 | -9 | 85 | 6 | 47 | -3 | 64 | 0 | 68 |
| 282 | 0 | 62 | -14 | 98 | -17 | 105 | -23 | 117 | 313 | -13 | 88 | 2 | 55 | 2 | 57 | -5 | 78 |
| 283 | -2 | 60 | -22 | 110 | -27 | 121 | -25 | 118 | 314 | 4 | 66 | 13 | 41 | -3 | 65 | 7 | 55 |
| 284 | -2 | 59 | -21 | 106 | -27 | 117 | -26 | 117 | 315 | -3 | 77 | 10 | 44 | -3 | 66 | 5 | 59 |
| 285 | -5 | 75 | -18 | 103 | -17 | 102 | -24 | 113 | 316 | -3 | 76 | 6 | 50 | 0 | 62 | 2 | 65 |
| 286 | -3 | 62 | -21 | 107 | -26 | 117 | -28 | 118 | 317 | -6 | 76 | 5 | 53 | 9 | 51 | 14 | 54 |
| 287 | -4 | 58 | -23 | 108 | -27 | 116 | -31 | 120 | 318 | 10 | 58 | 13 | 49 | -1 | 66 | 15 | 44 |
| 288 | -9 | 66 | -26 | 112 | -33 | 122 | -37 | 124 | 319 | -1 | 76 | 4 | 63 | -2 | 71 | 5 | 60 |
| 289 | -1 | 79 | -10 | 96 | -10 | 95 | -10 | 94 | 320 | -1 | 83 | 6 | 64 | -2 | 75 | 2 | 70 |
| 290 | 0 | 71 | -12 | 95 | -14 | 100 | -15 | 102 | 321 | -7 | 99 | -2 | 69 | -1 | 70 | -2 | 76 |
| 291 | 3 | 68 | -5 | 91 | -8 | 95 | -10 | 99 | 322 | -14 | 95 | -2 | 59 | -9 | 72 | -18 | 86 |
| 292 | 10 | 44 | -9 | 93 | -17 | 111 | -13 | 106 | 323 | 2 | 95 | 6 | 70 | 14 | 60 | 12 | 70 |
| 293 | -7 | 62 | -22 | 94 | -28 | 114 | -50 | 127 | 324 | 0 | 76 | 10 | 44 | 16 | 37 | 5 | 64 |
| 294 | 15 | 36 | -5 | 86 | -6 | 89 | -5 | 92 | 325 | -5 | 74 | 9 | 31 | 0 | 47 | -12 | 70 |
| 295 | 14 | 40 | 9 | 67 | -2 | 80 | 17 | 57 | 326 | 0 | 70 | 12 | 43 | 18 | 35 | 11 | 55 |
| 296 | 16 | 27 | -4 | 80 | -4 | 82 | -5 | 86 | 327 | -11 | 75 | 3 | 53 | 11 | 37 | 5 | 56 |
| 297 | 12 | 29 | -10 | 85 | -9 | 85 | -13 | 94 | 328 | 1 | 68 | 14 | 34 | 12 | 41 | 0 | 69 |
| 298 | 1 | 44 | -1 | 70 | -8 | 81 | -12 | 91 | 329 | 0 | 65 | 10 | 38 | 10 | 41 | 2 | 65 |
| 299 | 20 | 36 | 7 | 60 | -1 | 72 | -2 | 77 | 330 | -14 | 73 | -3 | 52 | 2 | 48 | -6 | 74 |
| 300 | 18 | 32 | 9 | 58 | 5 | 64 | 0 | 71 | 331 | 3 | 62 | 13 | 40 | 12 | 41 | 5 | 54 |
| 301 | 5 | 42 | 5 | 61 | 1 | 67 | -1 | 73 | 332 | 4 | 62 | 17 | 32 | 13 | 41 | 7 | 54 |
| 302 | 1 | 48 | 12 | 50 | 9 | 56 | 4 | 64 | 333 | -1 | 68 | 7 | 44 | 0 | 59 | -6 | 76 |
| 303 | 10 | 62 | 15 | 50 | 0 | 69 | -7 | 81 | 334 | -13 | 75 | 7 | 38 | 3 | 50 | -11 | 82 |
| 304 | 17 | 46 | 18 | 49 | 1 | 69 | 5 | 64 | 335 | 11 | 55 | 13 | 50 | 19 | 40 | -2 | 77 |
| 305 | 9 | 64 | 17 | 54 | 7 | 69 | 15 | 57 | 336 | 5 | 64 | 10 | 57 | 3 | 66 | -2 | 77 |
| 306 | -12 | 104 | 10 | 41 | -7 | 69 | 1 | 67 | 337 | 12 | 70 | 26 | 43 | 18 | 50 | 25 | 42 |
| 307 | -11 | 97 | 7 | 46 | -6 | 67 | 0 | 68 | | | | | | | | | |

Table 11 – Values of variables m and n for ctxIdx from 277 to 337

FIG 4L

| ctxIdx | I and SI slices | | Value of cabac_init_idc | | | | | | ctxIdx | I and SI slices | | Value of cabac_init_idc | | | | | |
|---|---|---|---|---|---|---|---|---|---|---|---|---|---|---|---|---|---|
| | | | 0 | | 1 | | 2 | | | | | 0 | | 1 | | 2 | |
| | m | n | m | n | m | n | m | n | | m | n | m | n | m | n | m | n |
| 338 | 15 | 6 | 14 | 11 | 19 | -6 | 17 | -13 | 369 | 32 | -26 | 31 | -4 | 40 | -37 | 37 | -17 |
| 339 | 6 | 19 | 11 | 14 | 18 | -6 | 16 | -9 | 370 | 37 | -30 | 27 | 6 | 38 | -30 | 32 | 1 |
| 340 | 7 | 16 | 9 | 11 | 14 | 0 | 17 | -12 | 371 | 44 | -32 | 34 | 8 | 46 | -33 | 34 | 15 |
| 341 | 12 | 14 | 18 | 11 | 26 | -12 | 27 | -21 | 372 | 34 | -18 | 30 | 10 | 42 | -30 | 29 | 15 |
| 342 | 18 | 13 | 21 | 9 | 31 | -16 | 37 | -30 | 373 | 34 | -15 | 24 | 22 | 40 | -24 | 24 | 25 |
| 343 | 13 | 11 | 23 | -2 | 33 | -25 | 41 | -40 | 374 | 40 | -15 | 33 | 19 | 49 | -29 | 34 | 22 |
| 344 | 13 | 15 | 32 | -15 | 33 | -22 | 42 | -41 | 375 | 33 | -7 | 22 | 32 | 38 | -12 | 31 | -16 |
| 345 | 15 | 16 | 32 | -15 | 37 | -28 | 48 | -47 | 376 | 35 | -5 | 26 | 31 | 40 | -10 | 35 | 18 |
| 346 | 12 | 23 | 34 | -21 | 39 | -30 | 39 | -32 | 377 | 33 | 0 | 21 | 41 | 38 | -3 | 31 | 28 |
| 347 | 13 | 23 | 39 | -23 | 42 | -30 | 46 | -40 | 378 | 38 | 2 | 26 | 44 | 46 | -5 | 33 | 41 |
| 348 | 15 | 20 | 42 | -33 | 47 | -42 | 52 | -51 | 379 | 33 | 13 | 23 | 47 | 31 | 20 | 36 | 28 |
| 349 | 14 | 26 | 41 | -31 | 45 | -36 | 46 | -41 | 380 | 23 | 35 | 16 | 65 | 29 | 30 | 27 | 47 |
| 350 | 14 | 44 | 46 | -28 | 49 | -34 | 52 | -39 | 381 | 13 | 58 | 14 | 71 | 25 | 44 | 21 | 62 |
| 351 | 17 | 40 | 38 | -12 | 41 | -17 | 43 | -19 | 382 | 29 | -3 | 8 | 60 | 12 | 48 | 18 | 31 |
| 352 | 17 | 47 | 21 | 29 | 32 | 9 | 32 | 11 | 383 | 26 | 0 | 6 | 63 | 11 | 49 | 19 | 26 |
| 353 | 24 | 17 | 45 | -24 | 69 | -71 | 61 | -55 | 384 | 22 | 30 | 17 | 65 | 26 | 45 | 36 | 24 |
| 354 | 21 | 21 | 53 | -45 | 63 | -63 | 56 | -46 | 385 | 31 | -7 | 21 | 24 | 22 | 22 | 24 | 23 |
| 355 | 25 | 22 | 48 | -26 | 66 | -64 | 62 | -50 | 386 | 35 | -15 | 23 | 20 | 23 | 22 | 27 | 16 |
| 356 | 31 | 27 | 65 | -43 | 77 | -74 | 81 | -67 | 387 | 34 | -3 | 26 | 23 | 27 | 21 | 24 | 30 |
| 357 | 22 | 29 | 43 | -19 | 54 | -39 | 45 | -20 | 388 | 34 | 3 | 27 | 32 | 33 | 20 | 31 | 29 |
| 358 | 19 | 35 | 39 | -10 | 52 | -35 | 35 | -2 | 389 | 36 | -1 | 28 | 23 | 26 | 28 | 22 | 41 |
| 359 | 14 | 50 | 30 | 9 | 41 | -10 | 28 | 15 | 390 | 34 | 5 | 28 | 24 | 30 | 24 | 22 | 42 |
| 360 | 10 | 57 | 18 | 26 | 36 | 0 | 34 | 1 | 391 | 32 | 11 | 23 | 40 | 27 | 34 | 16 | 60 |
| 361 | 7 | 63 | 20 | 27 | 40 | -1 | 39 | 1 | 392 | 35 | 5 | 24 | 32 | 18 | 42 | 15 | 52 |
| 362 | -2 | 77 | 0 | 57 | 30 | 14 | 30 | 17 | 393 | 34 | 12 | 28 | 29 | 25 | 39 | 14 | 60 |
| 363 | -4 | 82 | -14 | 82 | 28 | 26 | 20 | 38 | 394 | 39 | 11 | 23 | 42 | 18 | 50 | 3 | 78 |
| 364 | -3 | 94 | -5 | 75 | 23 | 37 | 18 | 45 | 395 | 30 | 29 | 19 | 57 | 12 | 70 | -16 | 123 |
| 365 | 9 | 69 | -19 | 97 | 12 | 55 | 15 | 54 | 396 | 34 | 26 | 22 | 53 | 21 | 54 | 21 | 53 |
| 366 | -12 | 109 | -35 | 125 | 11 | 65 | 0 | 79 | 397 | 29 | 39 | 22 | 61 | 14 | 71 | 22 | 56 |
| 367 | 36 | -35 | 27 | 0 | 37 | -33 | 36 | -16 | 398 | 19 | 66 | 11 | 86 | 11 | 83 | 25 | 61 |
| 368 | 36 | -34 | 28 | 0 | 39 | -36 | 37 | -14 | | | | | | | | | |

Table 12 – Values of variables m and n f r ctxIdx from 338 to 398

FIG 5

| data types | Table-No. | Slice type | | | |
|---|---|---|---|---|---|
| | | SI | I | P, SP | B |
| slice types | 2,3 | | | 11-13 | 24-26 |
| | 7 | 70-72 | 70-72 | 70-72 | 70-72 |
| macroblock layer control data | 1,2,3 | 0-10 | 3-10 | 14-20 | 27-35 |
| | 7 | 73-76 | 73-76 | 73-76 | 73-76 |
| | 7 | 77-84 | 77-84 | 77-84 | 77-84 |
| | 6 | 60-63 | 60-63 | 60-63 | 60-63 |
| macroblock prediction data | 6 | 68 | 68 | 68 | 68 |
| | 6 | 69 | 69 | 69 | 69 |
| | 6 | 64-67 | 64-67 | 64-67 | 64-67 |
| additional prediction data | 5 | | | 54-59 | 54-59 |
| | 5 | | | | 54-59 |
| | 4 | | | 40-46 | 40-46 |
| | 4 | | | | 40-46 |
| | 4 | | | 47-53 | 47-53 |
| | 4 | | | | 47-53 |
| | 2,3 | | | 21-23 | 36-39 |
| residual data | 7 | 85-104 | 85-104 | 85-104 | 85-104 |
| | 8,11 | 105-165, 277-337 | 105-165, 277-337 | 105-165, 277-337 | 105-165, 277-337 |
| | 9,12 | 166-226, 338-398 | 166-226, 338-398 | 166-226, 338-398 | 166-226, 338-398 |
| | 10 | 227-275 | 227-275 | 227-275 | 227-275 | ctxIdx values

APPARATUS AND METHODS FOR ENTROPY-ENCODING OR ENTROPY-DECODING USING AN INITIALIZATION OF CONTEXT VARIABLES

FIELD OF THE INVENTION

The present invention relates to entropy encoding/decoding and, in particular, to entropy encoding/decoding of video signals using a context-based adaptive binary arithmetic coding scheme with initialization

DESCRIPTION OF RELATED ART

Natural camera-view video signals as certain examples for general information signals show, as other information signals, a non-stationary statistical behavior. The statistics of these signals largely depend on the video content and the acquisition process. Traditional concepts of video coding that rely on a mapping from the video signal to a bit stream of variable length-coded syntax elements exploit some of the non-stationary characteristics but certainly not all of them. Moreover, higher-order statistical dependencies on a syntax element level are mostly neglected in existing video coding schemes.

In contrast to the variable length coding, which is also known as Huffman coding, there also exist arithmetic coding schemes, which are mostly binary arithmetic coding schemes for a practical implementation of coding a sequence of information symbols having binary symbols. Such binary symbols are taken from a symbol set which has only two symbols, i.e., a binary "1", and a binary "0". A simple arithmetic coding scheme is based on a symbol set, which has a certain probability distribution for the occurrence of the respective symbols. In a situation, in which the symbol set is a binary symbol set and the two symbols, i.e., a binary "0" and a binary "1" are equally distributed, the probability information for each symbol equals to 0.5. The probability information for a binary "0" may for example indicate an interval starting from 0 and ending at 0.5, while the probability information for a binary "1" may include an interval starting at 0.5 and ending at 1.0.

The message to be encoded, which is represented by a symbol sequence of information symbols, i.e., a bit stream of zeros and ones is to be represented by a real interval between 0 and 1. Generally, the size of this interval decreases with an increasing message length. However, the number of required bits to indicate the interval increases in this situation. When an arithmetic encoder receives a first symbol, it identifies the interval, to which the first symbol "belongs", i.e., the interval between 0 and 0.5 or the interval between 0.5 and 1.0. Then, when the arithmetic encoder receives the second symbol, it subdivides the interval indicated when encoding the first symbol based on the second symbol. In case the second symbol is again a zero, the newly identified interval will be between 0 and 0.25. In case, however, the second symbol is a binary "1", the second interval will be between 0.25 and 0.5. This procedure is continued until all symbols of the message, i.e., the symbol sequence, are processed. As soon as one determines that a certain digit of the lower or higher bound of an indicated interval thus cannot change any more, which will, for example, be the case, when the interval is determined to lie between for example 0.31 and 0.39, the digit behind the comma, i.e., the "3" can be output. In binary terms, there can be output the bits that do not change any more, when the interval is further subdivided. Therefore, an arithmetic encoder works as a simultaneous input/output device, i.e., it will output bits although the message to be encoded has not been completely encoded.

In the above example, the assumption was valid that the probability information, i.e., the signal statistics, do not change from symbol to symbol. This assumption restricts the compression gain. Therefore, a context-based adaptive binary arithmetic coding scheme has been developed. This algorithm is described in: D. Marpe, G. Blattermann, and T. Wiegand, "Adaptive codes for H.26L," ITU-T SG16/Q.6 Doc. VCEG-L13, Eibsee, Germany, Jan. 2003-07-10.

Generally, to each symbol to be arithmetically encoded, a context variable specifying a probability model, i.e., probability information is assigned. This probability model is used for arithmetically coding the value of the symbol by a binary arithmetic coding engine.

An important property of arithmetic coding is the possibility to utilize a clean interface between modeling and coding such that in the modeling stage, a model probability distribution is assigned to the given symbols, which then, in the subsequent coding stage, drives the actual coding engine to generate a sequence of bits as a coded representation of the symbols according to the model distribution. Since it is the model that determines the code and its efficiency in the first place, it is of importance to design an adequate model that explores the statistical dependencies to a large degree and that this model is kept "up to date" during encoding.

However, there are significant model costs involved by adaptively estimating higher-order conditional probabilities.

Suppose a pre-defined set T. of past symbols, a so-called context template, and a related set $C=\{0, \ldots, C-1\}$ of contexts is given, where the contexts are specified by a modeling function F. For each symbol x to be coded, a conditional probability $p(x|F(z))$ is estimated by switching between different probability models according to the already coded neighboring symbols $z \in T$. After encoding x, the estimated conditional probability $p(x|F(z))$ is estimated on the fly by tracking the actual source statistics. Since the number of different conditional probabilities to be estimated for an alphabet size of m is high, it is intuitively clear that the model cost, which represents the cost of "learning" the model distribution, is proportional to the number of past symbols to the power of four.

This implies that by increasing the number C of different context models, there is a point, where overfitting of the model may occur such that inaccurate estimates of $p(x|F(z))$ will be the result.

This problem can be solved by imposing two severe restrictions on the choice of the context models. First, very limited context templates T consisting of a few neighbors of the current symbol to encode are employed such that only a small number of different context models C is effectively used.

Secondly, context modeling is restricted to selected bins of the binarized symbols. As a result, the model cost is drastically reduced, even though the ad-hoc design of context models under these restrictions may not result in the optimal choice with respect to coding efficiency.

Four basic design types of context models can be distinguished. The first type involves a context template with up to two neighboring syntax elements in the past of the current syntax element to encode, where the specific definition of the kind of neighborhood depends on the syntax element. Usually, the specification of this kind of context model for a specific bin is based on a modeling function of the related bin values for the neighboring element to the left and on top of the current syntax element, as shown in FIG. 9.

The second type of context models is only defined for certain data subtypes. For this kind of context models, the values of prior coded bins ($b_0, b_1, b_2, \ldots, b_{i-1}$) are used for the choice of a model for a given bin with index i. Note that these context models are used to select different models for different internal nodes of a corresponding binary tree.

Both the third and fourth type of context models is applied to residual data only. In contrast to all other types of context models, both types depend on context categories of different block types. Moreover, the third type does not rely on past coded data, but on the position in the scanning path. For the fourth type, modeling functions are specified that involve the evaluation of the accumulated number of encoded (decoded) levels with a specific value prior to the current level bin to encode (decode).

Besides these context models based on conditional probabilities, there are fixed assignments of probability models to bin indices for all those bins that have to be encoded in regular mode and to which no context model of the previous specified category can be applied.

The above described context modeling is suitable for a video compression engine such as video compression/decompression engines designed in accordance with the presently emerging H.264/AVC video compression standard. To summarize, for each bin of a bin string the context modeling, i.e., the assignment of a context variable, generally depends on the to be processed data type or sub-data type, the position of the binary decision inside the bin string as well as the values of previously coded syntax elements or bins. With the exception of special context variables, the probability model of a context variable is updated after each usage so that the probability model adapts to the actual symbol statistics.

The problem arising from such context-based adaptive binary arithmetic coding engines is the issue what is to be done, when a start symbol of a symbol sequence is to be processed. Here, no previously coded information symbols are present, since the start symbol is the first symbol in the symbol sequence. The straightforward way is to choose a "50%:50%" initialization probability information, which means that the symbol statistics of the start symbol is not known, i.e., the symbol may be zero or may be one in the binary case. In a symbol set with more than two symbols, which is the non-binary case, wherein m is >2, this corresponds to the use of an equi-probable distribution among all symbols in the symbol set as an initialization probability information. It has been found out that, especially at low bit-rates and/or in connection with relatively small slices, i.e., with relatively small symbol sequences, the rate-distortion performance of the arithmetic coding engine depends on the initialization of the context modeler. Additionally, it has been found out that depending on certain video sequences, the bit-rate, which is needed to adapt the probability models of the context variables to the actual symbol statistics, can represent a substantial amount of the slice bit-rate. Therefore, especially for low bit-rate applications or relatively short symbol sequences, a degradation of compression efficiency has been discovered.

SUMMARY OF THE INVENTION

It is the object of the present invention to provide an improved entropy encoding design with higher compression efficiency.

In accordance with the first aspect of the present invention, this object is achieved by an apparatus for entropy-encoding a symbol sequence of information symbols to obtain entropy-encoded information symbols, the symbol sequence having a start symbol, comprising: an arithmetic encoder for arithmetically encoding a symbol of the symbol sequence based on probability information for the symbol, the symbol being part of a symbol set, to produce the entropy-encoded information symbols; a context modeler for deriving the probability information for the symbol based on a context of the symbol, the context including one or more context symbols processed by the arithmetic encoder prior to processing the symbol, the context modeler including an initializer for initializing the context modeler by determining and providing initialization probability information to the arithmetic encoder, the initialization probability information to be used by the arithmetic encoder for processing the start symbol, wherein the initializer is operative to determine the initialization probability information based on an estimation of symbol statistics relating to the start symbol such that an initialization probability distribution is different from an equi-probable distribution for all symbols of the symbol set.

In accordance with a second aspect of the present invention, this object is achieved by an apparatus for entropy decoding entropy-encoded information symbols, the entropy-encoded information symbols being produced by arithmetically encoding a symbol of the symbol sequence based on probability information for the symbol, the symbol being part of a symbol set, wherein the probability information for the symbol is derived based on a context of the symbol, the context including one or more context symbols processed earlier, and wherein, for arithmetically encoding the start symbol, an initialization probability information was used, the initialization probability information being based on an estimation of a symbol statistics relating to a start symbol and being determined such that an initialization probability distribution is different from an equi-probable distribution for all symbols of the symbol set, comprising:

an arithmetic decoder for arithmetically decoding the entropy-encoded information symbols to obtain the symbol sequence of information symbols having the start symbol; and a context modeler for obtaining the probability information used when arithmetically encoding the sequence of information symbols, context modeler including an initializer for obtaining the initialization probability information used when arithmetically encoding the start symbol.

The present invention is based on the finding that an improved compression efficiency can be obtained by initializing the context modeler so that the initialization probability information is different from an equi-probable distribution for all symbols of the symbol set in question. Particularly, the initializer is operative to determine the initialization probability information to be used at least for the start symbol of the symbol sequence based on an estimation of a symbol statistics relating to the start symbol so that the initialization probability information is different from an equi-probable distribution for all symbols of the symbol set.

In particular, this "intelligent" initialization is advantageous for coding of video material with widely varying content from different video sources. It has been found out that, in a preferred embodiment of the present invention, the initializing probability information can be derived based on the quantization parameter used for quantizing the to be encoded information. In video coding applications, and, in particular, in video encoding applications in connection with the newly emerging H.264/AVC video compression standard, the symbol sequence of information symbols to be entropy-encoded is derived from transformed residual values, which are obtained by a time/spatial inter/intra frame prediction mode for example.

Additionally, it has been found out that the intelligent initialization in accordance with the present invention can advantageously be based on prior knowledge on the video source material. In particular, it has been found out that the compression efficiency can be enhanced by defining several sets of initialization values. In accordance with the present invention, for so-called I- or SI-slices, a single set of initialization values is sufficient. For temporally predictive-coded slices such as the so-called P-, SP- or B-slices, more than one and, preferably, three different sets of initialization values are defined. For these slices, the selected set of initialization values is to be specified by a certain syntax element in the encoder output bit stream so that a decoder processing an encoded output bit stream is able to correctly initialize itself. Preferably, this syntax element is transmitted as part of the slice header. Now, the encoder has the freedom to select the set of initialization values that is the most suitable one for the symbol statistics for each slice.

Preferably, the initialization values are further diversified by detecting, to which data type or sub-data type, the symbol sequence to be processed by the arithmetic encoder belongs to. This certain type is indicated by a context index variable. This context index variable is preferably designed so that it can signal one out of up to 399 different context models from which a corresponding number of initialization probability information can be derived so that an optimally adapted initialization for a large number of different symbol sequences, each of which having a start symbol, can be determined.

It has to be noted, that the to be arithmetically coded symbols have attributed thereto different context models. Preferably, several symbols or bits are to be encoded using one context model out of the plurality of context models. These several symbols or bits form the symbol sequence, wherein the first to be encoded symbol of the symbol sequence, the symbol sequence having attributed thereto a context model, is the start symbol. A context model can include one or even more than one probability models. In case of a context model having more than one probability models, for each change of probability models, a new initialization will take place.

BRIEF DESCRIPTION OF THE DRAWINGS

Preferred embodiments of the present invention are described in detail with respect to the enclosed drawings, in which:

FIG. 2 shows a detailed diagram of the initializer from FIG. 1;

FIG. 3 shows a sequence of steps for calculating a reference index to reference an initialization probability information table including probability information for the least probable symbol (LPS) and a value of the corresponding most probable symbol (MPS) as initialization probability information;

FIGS. 4a to 4l show initialization tables referenced by the context index and an initialization index;

FIG. 5 shows a table for illustrating the interrelation of data types on the one hand and initialization tables on the other hand.

DETAILED DESCRIPTION OF PREFERRED EMBODIMENTS

Figure 1:
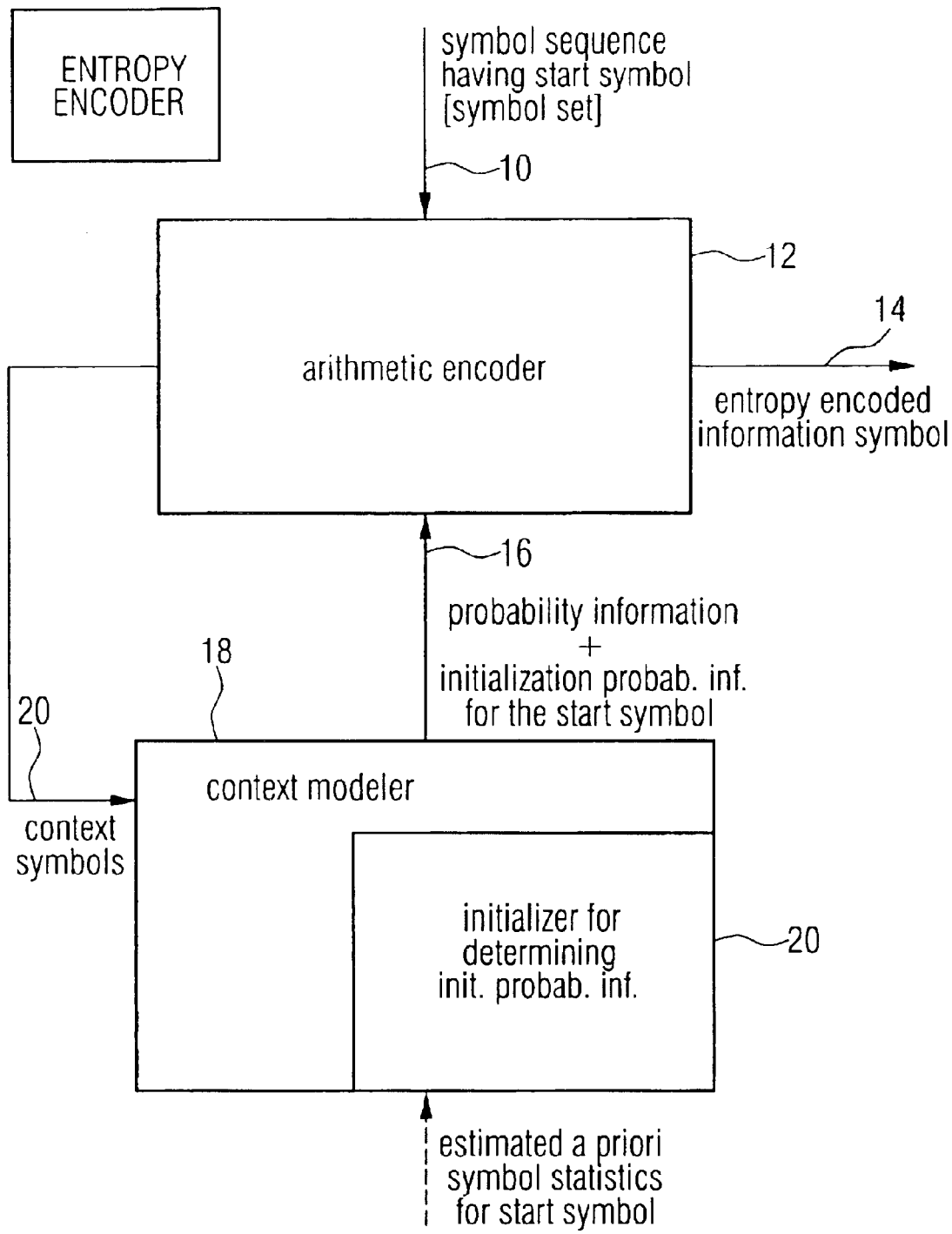
FIG. 1 shows a block diagram of an inventive entropy encoder.

In the following, reference is made to FIG. 1 for illustrating the structure and functionality of an inventive entropy-encoding apparatus or an entropy-encoding method. In particular, FIG. 1 shows an apparatus for entropy-encoding symbol sequences of information symbols to obtain entropy-encoded information symbols, wherein the symbol sequence has a start symbol. The symbol sequence is input into a symbol sequence input of an arithmetic encoder 12. The entropy-encoded information symbols are output at an entropy-encoder output 14, which is also connected to the arithmetic encoder 12. The arithmetic encoder is operative for arithmetically encoding a symbol of the symbol sequence based on probability information for the symbol. The probability information is input into the arithmetic encoder 12 via a probability information input 16. Since the symbol is part of a specified symbol set, which, in the binary case, only includes two different symbols, i.e., a binary "0" and the binary "1", it is sufficient to provide probability information only for one symbol of the symbol set. In accordance with the present invention, it is preferred to provide the probability information of the least probable symbol (LPS), since this number is naturally smaller than the probability for the most probable symbol. Additionally, the probability information provided to the arithmetic encoder via the probability information input 16 includes the value of the most probable symbol, from which the value of the least probable symbol and vice versa can be easily derived.

The inventive encoder further includes the context modeler 18 for deriving the probability information for the symbol based on a context of the symbol, the context including one or more context symbols input into the context modeler by a context input 20, which have been processed by the arithmetic encoder 12 prior to processing the actual symbol.

In accordance with the present invention, the context modeler 18 includes an initializer 20 for initializing the context modeler by determining and providing initialization probability information to the arithmetic encoder 12, when the initialization probability information is to be used by the arithmetic encoder 12 for processing the start symbol, i.e., the symbol of the symbol sequence, for which no context symbols exist, i.e. symbols which have been processed by the arithmetic encoder 12 prior to the start symbol. This means that, since the arithmetic encoding scheme is a strictly serial scheme, the start symbol is the first symbol of the symbol sequence.

The initializer is operative to determine the initialization probability information based on an estimation of symbol statistics relating to the start symbol such that the initialization probability is different from an equi-probable distribution for all symbols of the symbol set, to which the start symbol belongs to.

In accordance with the present invention, since the context modeler, and, therefore, the arithmetic encoder is initialized in an intelligent way based on an estimation of the symbol statistics that are expected for the symbol sequence to be encoded by the arithmetic encoder, the inventive entropy-encoding apparatus shows an improved start-up performance. Stated in other words, the entropy-encoding apparatus behaves, for the start symbol, as if the start symbol is not the first symbol of a sequence but is an intermediate symbol of a sequence. Therefore, the initialization results in a pre-adaptation of the entropy-encoding apparatus already for the start symbol. Contrary to the straightforward approach, in which the initialization probability information is set to an equi-probable distribution, the arithmetic encoder is immediately context-pre-adapted. In the straightforward case, the context-adaptation would need several steps corresponding to the number of prior encoded symbols forming the context symbols.

It has been found out that the inventive initialization of the context modeler and the arithmetic encoder results, without any further actions, in bit-rate savings of up to 3% simply by providing an intelligent initialization probability information compared to a straightforward equi-probable distribution.

FIG. 2 shows a preferred embodiment of the initializer 20 from FIG. 1. The initializer 20 includes a retriever for retrieving a quantization parameter for the symbol sequence from a slice header. Additionally, the slice header is also input into a detector for detecting a data type of the slice data. Additionally, a detector 204 for detecting a sub-data type in the slice data is provided. The detector 204 is further operative to access different initialization tables based on the detected sub-data type. As it will be described later on, the access to different initialization tables is controlled by means of a context index on the one hand and, preferably, by means of an initialization index on the other hand. Depending on the slice data, there only exists one initialization table with certain context indices for I- and SI-slices. For P- and B-slices, there exist at least two and preferably three initialization tables which are, once again, addressed by the context index, wherein the table of the at least two tables which is actually used is addressed by the initialization index.

Connected to the retriever 200 on the one hand and the detector 204 on the other hand, is a calculator 206, which is operative to calculate the information on the initialization probability which can be the actual initialization probability or, in accordance with the preferred embodiment of the present invention, a probability state index, i.e., a reference to an initialization probability information table including probability information for the least probable symbol. It has been found out by the inventors that a linear dependence of the initialization probability from the quantization parameter used for quantizing the slice data results in an improved compression efficiency, i.e., in an near to optimum initialization. Therefore, the calculator 206 in FIG. 2 is operative to apply a linear calculation, wherein the parameter m indicates a gradient of the linear dependence, while the other initialization parameter, i.e., n indicates a y-axis offset. The basic equation processed by the calculator 206 in FIG. 2 is indicated in block 206 as $$m \times QP + n,$$

wherein QP is the quantization parameter while m and n are the initialization parameters taken out from different initialization tables addressed by a certain context index.

In a preferred embodiment of the present invention, the calculator 206 in FIG. 2 performs the sequence of steps as indicated in FIG. 3. In a first step, the equation m×sliceQP+ n is calculated. It is to be noted here that in the preferred embodiment of FIG. 3, the value F of m×sliceQP is shifted to the right by four digits. It is to be noted here that, naturally, all values are binary strings. The shift by four digits relates to a representation of the product m×sliceQP in a two-complementary presentation. Then, the result after the shift is added to the other initialization parameter n. Then, the minimum of this result on one hand and the integer value 126 on the other hand is selected. In case this minimum is larger than 1, this minimum is selected and assigned to the auxiliary variable preCtxstate. Then, a determination is made, if this auxiliary variable is lower than or equal to 63. In case this determination results in a yes answer, the probability state index variable pStateIdx is calculated as the difference between 63 and the auxiliary variable. Additionally, it is determined that the value of the most probable symbol (valMPS) is equal to zero. In the other case, i.e., in which the auxiliary variable is greater than 63, the probability state index pStateIdx is calculated as the difference between the auxiliary variable on the one hand and the value of 64. Additionally, the value of the most probable symbol is set to one.

It is to be noted that the probability state index is.a reference to an initialization probability information table including probability information for the least probable symbol. The value of the probability state index can address 64 different probability information values in the probability information table. The reason for firstly calculating a probability state index and then addressing a table using the probability state index is in an improved design of the actual arithmetic encoder core. Naturally, by an appropriate mapping, the sequence of the steps shown in FIG. 3 could also directly calculate the initialization probability information.

It is to be noted here that arithmetic encoding is based on the principle of recursive intervals subdivision. Given the probability estimation p(0) and p(1)=1−p(0) of a binary decision (0,1), an initially given code sub-interval with a certain code range called CODIRange will be subdivided into two sub-intervals having the range p(0)×CODIRange and CODIRange−p(0)×CODIRange, respectively. Depending on the decision, which has been observed, a corresponding sub-interval will be chosen as the new code interval, and the binary code string pointing into that interval will represent the sequence of observed binary decisions. It is useful to distinguish between the most probable symbol (MPS) and the least probable symbol (LPS), so that binary decisions have to be identified as either MPS or LPS, rather than "0" or "1". Given this terminology, each context is specified by the probability $p_{LPS}$ of the LPS and the value of MPS (valMPS), which is either "0" or "1".

The probability estimation is performed by means of a finite-state machine with a table-based transition process between 64 different representative probability states indicated by the probability state index shown in FIG. 3. For the LPS probability $p_{LPS}$ the number of the states is arranged in such a way that the probability state index pStateIdx=0 corresponds to an LPS probability value of 0.5, with decreasing LPS probability towards higher state indices.

Figure 8:
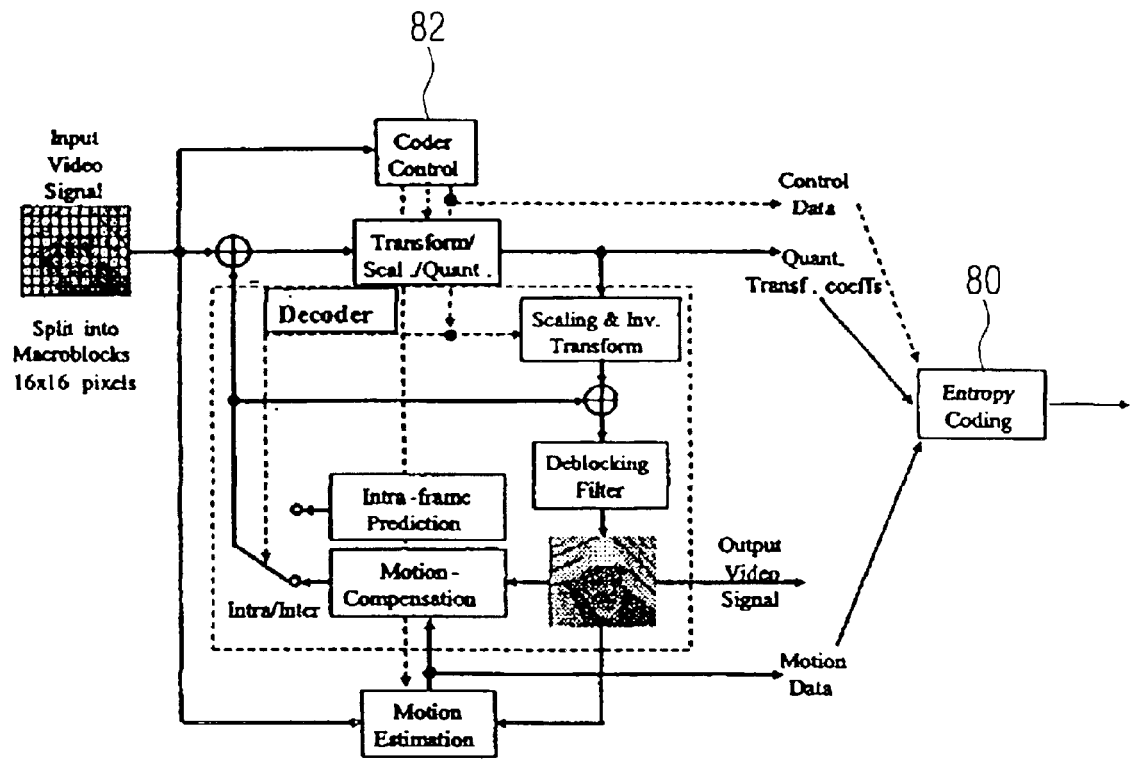
FIG. 8 shows a basic coding structure for the emerging H.264/AVC video encoder for a macro block.
Figure 9:
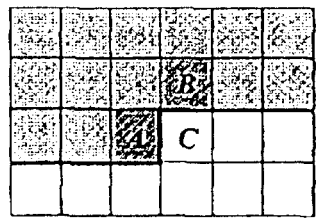
FIG. 9 illustrates a context template consisting of two neighboring syntax elements A and B to the left and on top of the current syntax element C.

In the following, reference is made to FIG. 8 to show the complete setup of a video encoder engine including an inventive entropy-encoder as it is shown in FIG. 8 in block 80. In particular, FIG. 8 shows the basic coding structure for the emerging H.264/AVC standard for a macro block. The input video signal is, split into macro blocks, each macro block having 16×16 pixels. Then, the association of macro blocks to slice groups and slices is selected, and, then, each macroblock of each slice is processed by the network of operating blocks in FIG. 8. It is to be noted here that an efficient parallel processing of macro blocks is possible, when there are various slices in the picture. The association of macro blocks to slice groups and slices is performed by means of a block called coder control 82 in FIG. 8. There exist several slices, which are defined as follows:

I slice: A slice in which all macroblocks of the slice are coded using intra prediction.

P slice: In addition, to the coding types of the I slice, some macroblocks of the P slice can also be coded using inter prediction with at most one motion-compensated prediction signal per prediction block.

B slice: In addition, to the coding types available in a P slice, some macroblocks of the B slice can also be coded using inter prediction with two motion-compensated prediction signals per prediction block.

The above three coding types are very similar to those in previous standards with the exception of the use of reference pictures as described below. The following two coding types for slices are new:

SP slice: A so-called switching P slice that is coded such that efficient switching between different precoded pictures becomes possible.

SI slice: A so-called switching I slice that allows an exact match of a macroblock in an SP slice for random access and error recovery purposes.

Figure 10:
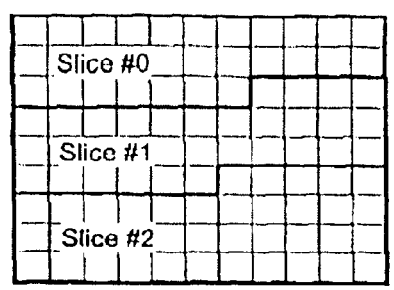
FIG. 10 shows an illustration of the subdivision of a picture into slices.

Slices are a sequence of macroblocks, which are processed in the order of a raster scan when not using flexible macroblock ordering (FMO). A picture maybe split into one or several slices as shown in FIG. 10. A picture is therefore a collection of one or more slices. Slices are self-contained in the sense that given the active sequence and picture parameter sets, their syntax elements can be parsed from the bitstream and the values of the samples in the area of the picture that the slice represents can be correctly decoded without use of data from other slices provided that utilized reference pictures are identical at encoder and decoder. Some information from other slices maybe needed to apply the deblocking filter across slice boundaries.

FMO modifies the way how pictures are partitioned into slices and macroblocks by utilizing the concept of slice groups. Each slice group is a set of macroblocks defined by a macroblock to slice group map, which is specified by the content of the picture parameter set and some information from slice headers. The macroblock to slice group map consists of a slice group identification number for each macroblock in the picture, specifying which slice group the associated macroblock belongs to. Each slice group can be partitioned into one or more slices, such that a slice is a sequence of macroblocks within the same slice group that is processed in the order of a raster scan within the set of macroblocks of a particular slice group. (The case when FMO is not in use can be viewed as the simple special case of FMO in which the whole picture consists of a single slice group.)

Using FMO, a picture can be split into many macroblock-scanning patterns such as interleaved slices, a dispersed macroblock allocation, one or more "foreground" slice groups and a "leftover" slice group, or a checker-board type of mapping.

Each macroblock can be transmitted in one of several coding types depending on the slice-coding type. In all slice-coding types, the following types of intra coding are supported, which are denoted as Intra_4×4 or Intra_16×16 together with chroma prediction and I_PCM prediction modes.

The Intra_4×4 mode is based on predicting each 4×4 luma block separately and is well suited for coding of parts of a picture with significant detail. The Intra_16×16 mode, on the other hand, does prediction of the whole 16×16 luma block and is more suited for coding very smooth areas of a picture.

In addition, to these two types of luma prediction, a separate chroma prediction is conducted. As an alternative to Intra_4×4 and Intra_16×16, the I_PCM coding type allows the encoder to simply bypass the prediction and transform coding processes and instead directly send the values of the encoded samples. The I_PCM mode serves the following purposes:

1. It allows the encoder to precisely represent the values of the samples
2. It provides a way to accurately represent the values of anomalous picture content without significant data expansion
3. It enables placing a hard limit on the number of bits a decoder must handle for a macroblock without harm to coding efficiency.

In contrast to some previous video coding standards (namely H.263+ and MPEG-4 Visual), where intra prediction has been conducted in the transform domain, intra prediction in H.264/AVC is always conducted in the spatial domain, by referring to neighboring samples of previously coded blocks which are to the left and/or above the block to be predicted. This may incur error propagation in environments with transmission errors that propagate due to motion compensation into inter-coded macroblocks. Therefore, a constrained intra coding mode can be signaled that allows prediction only from intra-coded neighboring macroblocks.

When using the Intra_4×4 mode, each 4×4 block is predicted from spatially neighboring samples. The 16 samples of the 4×4 block are predicted using prior decoded samples in adjacent blocks. For each 4×4 block one of nine prediction modes can be utilized. In addition, to "DC" prediction (where one value is used to predict the entire 4×4 block), eight directional prediction modes are specified. Those modes are suitable to predict directional structures in a picture such as edges at various angles.

In addition, to the intra macroblock coding types, various predictive or motion-compensated coding types are specified as P macroblock types. Each P macroblock type corresponds to a specific partition of the macroblock into the block shapes used for motion-compensated prediction. Partitions with luma block sizes of 16×16, 16×8, 8×16, and 8×8 samples are supported by the syntax. In case partitions with 8×8 samples are chosen, one additional syntax element for each 8×8 partition is transmitted. This syntax element specifies whether the corresponding 8×8 partition is further partitioned into partitions of 8×4, 4×8, or 4×4 luma samples and corresponding chroma samples.

The prediction signal for each predictive-coded M×N luma block is obtained by displacing an area of the corresponding reference picture, which is specified by a translational motion vector and a picture reference index. Thus, if the macroblock is coded using four 8×8 partitions and each 8×8 partition is further split into four 4×4 partitions, a maximum of sixteen motion vectors may be transmitted for a single P macroblock.

The quantization parameter SliceQP is used for determining the quantization of transform coefficients in H.264/AVC.

The parameter can take 52 values. Theses values are arranged so that an increase of 1 in quantization parameter means an increase of quantization step size by approximately 12% (an increase of 6 means an increase of quantization step size by exactly a factor of 2). It can be noticed that a change of step size by approximately 12% also means roughly a reduction of bit rate by approximately 12%.

The quantized transform coefficients of a block generally are scanned in a zig-zag fashion and transmitted using entropy coding methods. The 2×2 DC coefficients of the chroma component are scanned in raster-scan order. All inverse transform operations in H.264/AVC can be implemented using only additions and bit-shifting operations of 16-bit integer values. Similarly, only 16-bit memory accesses are needed for a good implementation of the forward transform and quantization process in the encoder.

Figure 7:
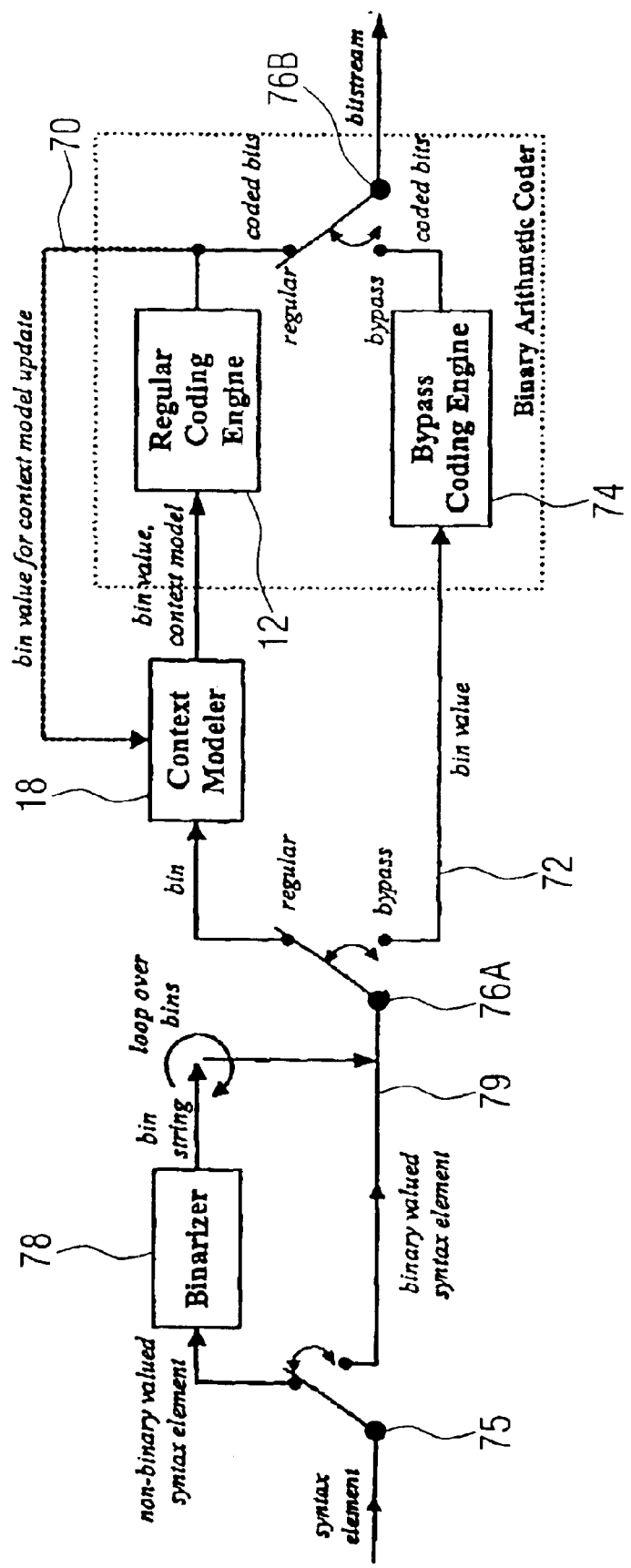
FIG. 7 shows a block diagram of a complete coding engine including a binarizer and bypass modes for the binarizer and the context modeler.

In the following, reference is made to FIG. 7 in order to show a detailed embodiment of the entropy encoder 80 in FIG. 8. In the preferred embodiment of the present invention, the initializer 20 described in connection with FIG. 1 is part of a context modeler 18 in FIG. 7, which is preferably the same device as described in connection with FIG. 1. The context modeler feeds a context model, i.e., a probability information, to an arithmetic encoder 12, which is also referred to as the regular coding engine. In the implementation in FIG. 7, also the to be encoded bit, which is also referred to as a bin, which means binary decision, is also forwarded from the context modeler 18 to the regular coding engine 12. This bin value is also fed back to the context modeler so that a context model update can be obtained which is illustrated by means of feed back line 70. The device shown in FIG. 7 also includes a bypass branch 72, which also includes an arithmetic encoder, which is also called the bypass coding engine 74. The bypass coding engine 74 is operative to arithmetically encode the input bin values. Contrary to the regular coding engine 12 the bypass coding engine 74 is, however, not an adaptive coding engine but works preferably with a fixed probability model without any context adaptation. A selection of the two branches can be obtained by means of switches 76a and 76b as it is shown in FIG. 7. The bypass switch 76a is located between the coding engine branches and a binarizer device 78. The binarizer device 78 is operative to binarize non-binary valued syntax elements for obtaining a bin string, i.e., a string of binary values. In case the syntax element is already a binary value syntax element, the binarizer 78 is bypassed by the bypass branch 79, which is selected by means of a binarizer bypass switch 75.

FIG. 7, therefore, shows the generic block diagram for encoding a single syntax element in CABAC (CABAC= Context-based Adaptive Binary Arithmetic Coding). The encoding process consists of at most three elementary steps:

1. binarization
2. context modeling
3. binary arithmetic coding

In the first step, a given non-binary valued syntax element is uniquely mapped to a binary sequence, a so-called bin string. When a binary valued syntax element is given, this initial step is bypassed, as shown in FIG. 7. For each element of the bin string or for each binary valued syntax element, one or two subsequent steps may follow depending on the coding mode.

In the co-called regular coding mode, prior to the actual arithmetic coding process the given binary decision, which, in the sequel, we will refer to as a bin, enters the context modeling stage, where a probability model is selected such that the corresponding choice may depend on previously encoded syntax elements or bins. Then, after the assignment of a context model the bin value along with its associated model is passed to the regular coding engine, where the final stage of arithmetic encoding together with a subsequent model updating takes place (see FIG. 7).

Alternatively, the bypass coding mode is chosen for selected bins in order to allow a speedup of the whole encoding (and decoding) process by means of a simplified coding engine without the usage of an explicitly assigned model, as illustrated by the lower right branch of the switch in FIG. 7.

In the following, the three main functional building blocks, which are binarization, context modeling, and binary arithmetic coding, along with their interdependencies are discussed in more detail.

In the following, several details on binary arithmetic coding will be set forth.

Binary arithmetic coding is based on the principles of recursive interval subdivision that involves the following elementary multiplication operation. Suppose that an estimate of the probability $P_{LPS} \in (0, 0.5]$ of the least probable symbol (LPS) is given and that the given interval is represented by its lower bound L and its width (range) R. Based on that settings, the given interval is subdivided into two sub-intervals: one interval of width $$R_{LPS} = R \times p_{LPS},$$

which is associated with the LPS, and the dual interval of width $R_{MPS} = R - R_{LPS}$, which is assigned to the most probable symbol (MPS) having a probability estimate of $1 - p_{LPS}$. Depending on the observed binary decision, either identified as the LPS or the MPS, the corresponding sub-interval is then chosen as the new current interval. A binary value pointing into that interval represents the sequence of binary decisions processed so far, whereas the range of the interval corresponds to the product of the probabilities of those binary symbols. Thus, to unambiguously identify that interval and hence the coded sequence of binary decisions, the Shannon lower bound on the entropy of the sequence is asymptotically approximated by using the minimum precision of bits specifying the lower bound of the final interval.

In a practical implementation of binary arithmetic coding the main bottleneck in terms of throughput is the above multiplication operation required to perform the interval subdivision.

In the following, the scheme shown in FIG. 2 will be described in more detail.

The basic self-contained unit in video coding may be a slice. All models are to be re-initialized at the slice boundaries using some pre-defined probability states. In the absence of any prior knowledge about the source, one possible choice would be to initialize each model with the equi-probable state. However, CABAC provides a built-in mechanism for incorporating some a priori knowledge about the source statistics in the form of appropriate initialization values for each of the probability models. This so-called initialization process for context models allows an adjustment of the initial probability states in CABAC on two levels.

Quantization Parameter Dependent Initialization

On the lower level of adjustment there is a default set of initialization values, which are derived from the initially given slice quantization parameter SliceQP, thus providing some kind of pre-adaptation of the initial probability states to the different coding conditions represented by the current value of the SliceQP parameter.(ctxIdx=0 to 398, ctxIdx≠276), from which the corresponding SliceQP dependent initial probability state is derived during the initialization process by applying the procedure shown in FIG. 3.

Slice Dependent Initialization

The concept of a low-level pre-adaptation of the probability models was generalized by defining two additional sets of context initialization parameters for those probability models specifically used in P and B slices. In this way, the encoder is enabled to choose for these slice types between three initialization tables such that a better fit to different coding scenarios and/or different types of video content can be achieved. This forward adaptation process requires the signaling of the chosen initialization table, which is done by specifying the corresponding table index (0–2) in the slice header. In addition, an increased amount of memory for the storage of the initialization tables is required. However, access to this memory of approx. 3 KB is needed only once per slice. Note that a chosen initialization table triggers for each probability model the same low-level, SliceQP dependent initialization procedure as described in the previous paragraph. Depending on the slice size and the bit-rate, which, in turn, depends on the amount of data that can be used for the backward adaptation process of the symbol statistics, bit-rate savings of up to 3% have been obtained by using the instrument of slice dependent context initialization.

FIGS. 4a to 4l show the initialization parameter tables. FIG. 4a for example shows a look up table to be addressed by the context index variable ctxidx as an input address ranging between 0 and 10 in order to retrieve appropriate initialization variables m, n that are to be input into the sequence of steps shown in FIG. 3. Table 1 shown in FIG. 4a is not suitable for P or B slices so that no initialization index or as has been described above, no table index is required. The situation is different in FIGS. 4b, 4c, 4d, 4e, 4g, 4h, 4i, 4j, 4k, 4l.

In all those figures the optimally selected initialization parameters or variables m, n, are not only based on the context index ctxIdx but are also based on a table or initialization index which is also termed as "cabac_init_idc" (CABAC initialization indicator). This means that all those tables where this table index "cabac_init_idc" is present, can be used for coding data in time-domain predicted P, SP and B frames.

FIG. 5 shows an example for assigning different context models to different data types. Data types are slice data, macroblock layer control data, macroblock prediction data, additional prediction data and residual data. All these different data types can be further diversified into sub-data types so that, for example for the data type residual data, there exist four different sub-data types to which different tables are assigned. Within one sub-data type, there is, preferably, another diversification into different elementary data types, so that, when one elementary data type is detected, a certain pair of initialization parameters m, n, is retrieved by means of a table look up to the tables shown in FIG. 4a to FIG. 4k based on the context index ctxidx. It is to be noted here that the right four columns in FIG. 5 show the attribution of context index values to data in a certain slice such as slice SI, slice I, slice B, slice SP or slice P.

The inventive initialization based on the a priori known symbol statistics are diversified to a large degree in that up to 398 different initialization probability information items can be calculated. In dependence of the slice quantization parameter and each data type, sub-data type or elementary data type, and also for a slice data type, optimum initialization probability information is calculated to "prime" the entropy encoder so that a maximum bit rate saving can be obtained. In accordance with the invention, bit rate saving losses due to a more or less quick adaptation of the context model because of a non-intelligent initialization are avoided.

Figure 6:
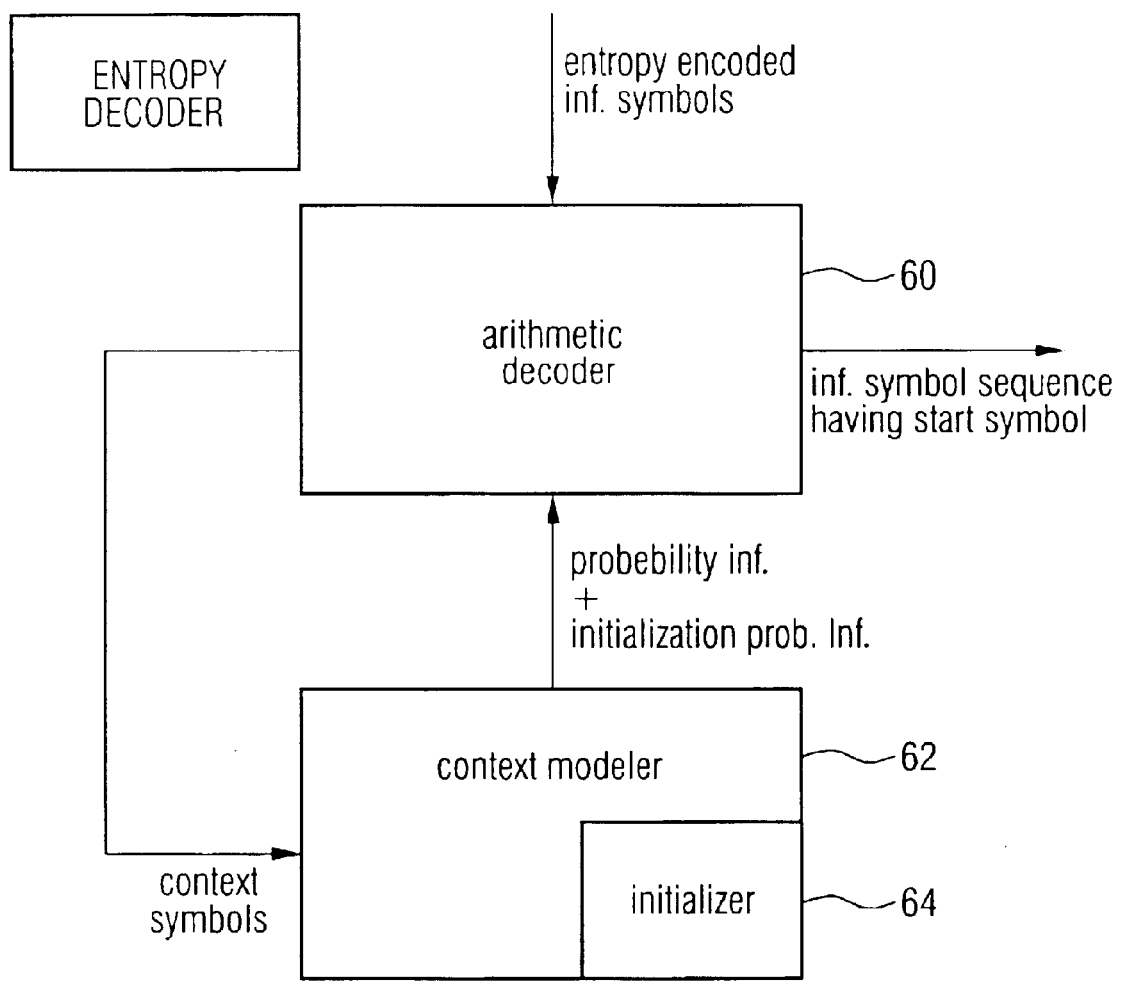
FIG. 6 shows a schematic block diagram of an inventive arithmetic decoder.

In the following, reference is made to FIG. 6 showing an inventive entropy decoder. As it is known in the art of arithmetic coding/decoding, the arithmetic decoder needs the same probability distribution used by the encoder for a respective encoding step to resolve the transmitted interval (which is naturally represented in binary form) into the decoded bits, i.e., the information symbol sequence having the start symbol. To this end, the inventive entropy decoder includes an arithmetic decoder 60 and a context modeler 62, which also includes an initializer 64. It is to be seen here that the decoder shown in FIG. 6 is analogously constructed as the encoder in FIG. 1. Again, the context modeler 62 provides probability information or, when the start symbol of the sequence is concerned, the initialization probability information. This information is produced in the same way as has been described with respect to FIG. 1, i.e., by determining a respective slice quantization parameter, by determining a certain context index and, by determining the corresponding initialization parameters m, n, for calculating the initialization probability information, when the arithmetic decoder is operative to process the start symbol. It is to be noted here that the arithmetic encoding/decoding chain is a kind of first-in-first-out pipeline, since the start symbol of the symbol sequence in the encoder is the first symbol to be encoded and is also the first symbol to be decoded. Therefore, the same initialization process for the entropy decoder shown in FIG. 6 can be used, which has been described in connection with the entropy encoder shown in FIG. 1.

Regarding the regular context adaptation mode, the context modeler also performs the same operational steps as have been described with respect to FIG. 1.

Depending on an actual implementation, the inventive encoding/decoding methods can be implemented in hardware or in software. Therefore, the present invention also relates to a computer program, which can be stored on a computer-readable medium such as a CD, a disk or any other data carrier. The present invention is, therefore, also a computer program having a program code which, when executed on a computer, performs the inventive method of encoding described in connection with FIG. 1 or the inventive method of decoding described in connection with FIG. 6.

What is claimed is:

1. Apparatus for entropy-encoding a symbol sequence of information symbols to obtain entropy-encoded information symbols, the symbol sequence having a start symbol, comprising:

an arithmetic encoder for arithmetically encoding a symbol of the symbol sequence based on probability information for the symbol, the symbol being part of a symbol set, to produce the entropy-encoded information symbols;

a context modeler for deriving the probability information for the symbol based on a context of the symbol, the context including one or more context symbols processed by the arithmetic encoder prior to processing the symbol, the context modeler including an initializer for initializing the context modeler by determining and providing initialization probability information to the arithmetic encoder, the initialization probability information to be used by the arithmetic encoder for processing the start symbol, wherein the initializer is operative to determine the initialization probability information based on an estimation of symbol statistics relating to the start symbol such that an initialization probability distribution is different from an equi-probable distribution for all symbols of the symbol set.

2. Apparatus in accordance with claim 1, in which the information symbols are derived from quantized input values, the quantized input values being derived from input values by means of a quantizing algorithm controlled by a quantizing parameter, and in which the initializer is operative to determine the initialization probability information dependent on the quantizing parameter.

3. Apparatus in accordance with claim 2, in which the initializer is operative to linearly derive the initialization probability information from the quantizing parameter.

4. Apparatus in accordance with claim 3, in which the initializer is operative to calculate the initialization probability information based on the following equation:

$$y = m \times QP + n,$$

wherein y is an initialization variable, QP is the quantizing parameter, m is a predetermined gradient information, and n is a predetermined y offset information, wherein the initializer is operative to obtain the initialization parameters m, n by accessing a memory, in which the initialization parameters are stored, using a context index for the start symbol.

5. Apparatus in accordance with claim 1, in which the information symbols in the symbol sequence are derived from a plurality of different types of information, and in which the initializer is operative to detect the type of information to which the symbol sequence to be processed by the arithmetic encoder belongs to, and in which the initializer is further operative to determine the initialization probability information for the start symbol based on detected type of information.

6. Apparatus in accordance with claim 5, in which the different types of information include, as a first type, video data belonging to an I slice OR an SI slice, and, as a second type, video data belonging to a P slice, a SP slice or a B slice.

7. Apparatus in accordance with claim 6, in which there exist different sub-types of information for video data of a P slice, a SP slice or a B slice, in which the initializer is operative to determine the initialization probability information based on detected sub-type of information, and in which the initializer is further operative to signal the detected sub-type by means of an initialization index.

8. Apparatus in accordance with claim 1, in which the symbol set is binary and includes only a binary "1" and a binary "0" as the symbols, and in which the equi-probable distribution is 0.5 for each symbol.

9. Apparatus in accordance with claim 1, in which the context modeler is operative to determine a probability of the least probable symbol and the value of the most probable symbol as the probability information.

10. Apparatus in accordance with claim 1, in which the initializer is operative to determine the probability information of the least probable symbol and a value of the most probable symbol as the initialization probability information.

11. Apparatus in accordance with claim 1, in which some of the information symbols are derived from transformed residual data, the residual data representing a spatial-domain prediction error of the predicted video signal compared to an actual video signal.

12. Apparatus in accordance with claim 1, in which the information symbols represent video data, in which video data are organized into slices, a slice including a plurality of macroblocks, a macroblock including a plurality of transformed residual values, a slice including a slice header and a first transform coefficient, wherein a first bit of a binarized representation of the first transform coefficient is the start symbol.

13. Apparatus in accordance with claim 1, in which the symbol set has an estimated a priori symbol statistics including an expected probability for a symbol in the symbol set, and in which the initializer is further operative to determine the initialization probability information based on the a priori known symbol statistics.

14. Method of entropy-encoding a symbol sequence of information symbols to obtain entropy-encoded information symbols, the symbol sequence having a start symbol, comprising the following steps:

arithmetically encoding a symbol of the symbol sequence based on probability information for the symbol, the symbol being part of a symbol set, to produce the entropy-encoded information symbols;

deriving the probability information for the symbol based on a context of the symbol, the context including one or more context symbols processed by the encoding step prior to processing the symbol, the step of deriving including the following step:

initializing the step of deriving by determining and providing initialization probability information to the encoding step, the initialization probability information to be used by the encoding step for processing the start symbol, wherein the initialization probability information is determined such that the initialization probability information based on an estimation of symbol statistics relating to the start symbol such that an initialization probability distribution is different from an equi-probable distribution for all symbols of the symbol set.

15. Apparatus for entropy decoding entropy-encoded information symbols, the entropy-encoded information symbols being produced by arithmetically encoding a symbol of the symbol sequence based on probability information for the symbol, the symbol being part of a symbol set, wherein the probability information for the symbol is derived based on a context of the symbol, the context including one or more context symbols processed earlier, and wherein, for arithmetically encoding the start symbol, an initialization probability information was used, the initialization probability information being based on an estimation of a symbol statistics relating to a start symbol and being determined such that an initialization probability distribution is different from an equi-probable distribution for all symbols of the symbol set, comprising:

an arithmetic decoder for arithmetically decoding the entropy-encoded information symbols to obtain the symbol sequence of information symbols having the start symbol; and a context modeler for obtaining the probability information used when arithmetically encoding the sequence of information symbols, context modeler including an initializer for obtaining the initialization probability information used when arithmetically encoding the start symbol.

16. Apparatus in accordance with claim 15, in which the symbol set has an estimated a priori symbol statistics including an expected probability for a symbol in the symbol set, and in which the initializer is operative to determine the initialization probability information based on the a priori symbol statistics.

17. Apparatus in accordance with claim 15, in which the initializer is operative to extract information on the initialization probability information from a data stream, which includes the entropy-encoded information symbols.

18. Apparatus in accordance with claim 17, in which the data stream includes a header, and in which the initializer is operative to parse the header for extracting information on the initialization probability information used for arithmetically encoding the start symbol.

19. Method of entropy decoding entropy-encoded information symbols, the entropy-encoded information symbols being produced by arithmetically encoding a symbol of the symbol sequence based on probability information for the symbol, the symbol being part of a symbol set, wherein the probability information for the symbol is derived based on a context of the symbol, the context including one or more context symbols processed earlier, and wherein, for arithmetically encoding the start symbol, an initialization probability information was used, the initialization probability information being based on an estimation of a symbol statistics relating to a start symbol and being determined such that an initialization probability distribution is different from an equi-probable distribution for all symbols of the symbol set, comprising the following steps:

arithmetically decoding the entropy-encoded information symbols to obtain the symbol sequence of information symbols having the start symbol; and context modeling for obtaining the probability information used when arithmetically encoding the sequence of information symbols, the step of context modeling including the step of initializing for obtaining the initialization probability information used when arithmetically encoding the start symbol.

20. Computer program having instructions for performing, when running on a computer, a method of entropy-encoding a symbol sequence of information symbols to obtain entropy-encoded information symbols, the symbol sequence having a start symbol, comprising the following steps:

arithmetically encoding a symbol of the symbol sequence based on probability information for the symbol, the symbol being part of a symbol set, to produce the entropy-encoded information symbols;

deriving the probability information for the symbol based on a context of the symbol, the context including one or more context symbols processed by the encoding step prior to processing the symbol, the step of deriving including the following step:

initializing the step of deriving by determining and providing initialization probability information to the encoding step, the initialization probability information to be used by the encoding step for processing the start symbol, wherein the initialization probability information is determined such that the initialization probability information based on an estimation of symbol statistics relating to the start symbol such that an initialization probability distribution is different from an equi-probable distribution for all symbols of the symbol set.

21. Computer program having instructions for performing, when running on a computer, a method of entropy decoding entropy-encoded information symbols, the entropy-encoded information symbols being produced by arithmetically encoding a symbol of the symbol sequence based on probability information for the symbol, the symbol being part of a symbol set, wherein the probability information for the symbol is derived based on a context of the symbol, the context including one or more context symbols processed earlier, and wherein, for arithmetically encoding the start symbol, an initialization probability information was used, the initialization probability information being based on an estimation of a symbol statistics relating to a start symbol and being determined such that an initialization probability distribution is different from an equi-probable distribution for all symbols of the symbol set, comprising the following steps:

arithmetically decoding the entropy-encoded information symbols to obtain the symbol sequence of information symbols having the start symbol; and context modeling for obtaining the probability information used when arithmetically encoding the sequence of information symbols, the step of context modeling including the step of initializing for obtaining the initialization probability information used when arithmetically encoding the start symbol.

* * * * *